US009380384B2

(12) United States Patent
Fitzgerald

(10) Patent No.: US 9,380,384 B2
(45) Date of Patent: Jun. 28, 2016

(54) SYSTEMS AND METHODS FOR PROVIDING A WIDEBAND FREQUENCY RESPONSE

(71) Applicant: QUALCOMM Incorporated, San Diego, CA (US)

(72) Inventor: Joseph Robert Fitzgerald, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 242 days.

(21) Appl. No.: 14/090,300

(22) Filed: Nov. 26, 2013

(65) Prior Publication Data

US 2015/0146885 A1 May 28, 2015

(51) Int. Cl.

| | |
|---|---|
| ***H03G 5/00*** | (2006.01) |
| ***H04R 3/04*** | (2006.01) |
| ***H04R 1/08*** | (2006.01) |
| ***H04R 17/02*** | (2006.01) |
| ***H04R 3/00*** | (2006.01) |
| *H04R 1/24* | (2006.01) |

(52) U.S. Cl.
CPC .. *H04R 3/04* (2013.01); *H04R 1/08* (2013.01); *H04R 3/005* (2013.01); *H04R 17/02* (2013.01); *H04R 1/245* (2013.01); *H04R 2201/003* (2013.01); *H04R 2430/20* (2013.01)

(58) Field of Classification Search
CPC ...... H04R 3/04; H04R 3/005; H04R 2430/20; H04R 1/08; H04R 17/02; H04R 1/245; H04R 2201/003
USPC ....................................... 381/98, 92, 122, 91
See application file for complete search history.

(56) References Cited

U.S. PATENT DOCUMENTS

| | | | | |
|---|---|---|---|---|
| 8,861,312 | B2 | 10/2014 | Altman et al. | |
| 2008/0049953 | A1 * | 2/2008 | Harney .................. | H04R 1/245 381/94.7 |
| 2008/0192962 | A1 | 8/2008 | Halteren | |
| 2009/0316916 | A1 | 12/2009 | Haila et al. | |
| 2010/0081487 | A1 | 4/2010 | Chen et al. | |
| 2010/0183167 | A1 | 7/2010 | Phelps et al. | |
| 2011/0142261 | A1 | 6/2011 | Josefsson | |
| 2012/0207315 | A1 | 8/2012 | Kimura et al. | |
| 2013/0208923 | A1 | 8/2013 | Suvanto | |

FOREIGN PATENT DOCUMENTS

| | | | |
|---|---|---|---|
| DE | 102013200070 | B3 | 3/2014 |
| WO | 2008014324 | A2 | 1/2008 |
| WO | 2008111011 | A2 | 9/2008 |

OTHER PUBLICATIONS

International Search Report and Written Opinion—PCT/US2014/066708—ISA/EPO—Feb. 12, 2015.

* cited by examiner

*Primary Examiner* — Paul S Kim
(74) *Attorney, Agent, or Firm* — Austin Rapp & Hardman

(57) ABSTRACT

Electronic circuitry is described. The electronic circuitry includes a first microelectromechanical system (MEMS) structure that exhibits a first frequency response in a voice frequency range and that captures a first signal. The electronic circuitry also includes a second MEMS structure coupled to the first MEMS structure. The second MEMS structure exhibits a second frequency response in an ultrasound frequency range and captures a second signal. A combination of the first frequency response and the second frequency response achieves a target frequency response in a combined frequency range.

20 Claims, 22 Drawing Sheets

SYSTEMS AND METHODS FOR PROVIDING A WIDEBAND FREQUENCY RESPONSE

TECHNICAL FIELD

The present disclosure relates generally to electronic devices. More specifically, the present disclosure relates to systems and methods for providing a wideband frequency response.

BACKGROUND

The use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform new functions and/or that perform functions faster, more efficiently or with higher quality are often sought after.

Some electronic devices (e.g., cellular phones, smartphones, audio recorders, camcorders, computers, etc.) utilize audio signals. These electronic devices may capture, receive, encode, store and/or transmit the audio signals. For example, a smartphone may capture a speech signal for a phone call.

However, use of audio signals is limited by current technology. For example, current microphone technology may perform poorly in capturing certain signals. As can be observed from this discussion, systems and methods that improve audio signal capture may be beneficial.

SUMMARY

Electronic circuitry is described. The electronic circuitry may include a first microelectromechanical system (MEMS) structure that may exhibit a first frequency response in a voice frequency range and that may capture a first signal. The electronic circuitry may also include a second MEMS structure coupled to the first MEMS structure. The second MEMS structure may exhibit a second frequency response in an ultrasound frequency range and capture a second signal. A combination of the first frequency response and the second frequency response may achieve a target frequency response in a combined frequency range.

The electronic circuitry may include a high-pass filter coupled to the second MEMS structure. The high-pass filter may mitigate audio frequency range intermodulation distortion (IMD) caused by the second signal.

The electronic circuitry may include automatic gain control (AGC) circuitry coupled to the second MEMS structure. The AGC circuitry may adjust processing in the ultrasound frequency range when a signal level meets or exceeds a threshold. Adjusting the processing may include deactivating the second MEMS structure. Adjusting the processing may include adjusting the frequency response of the second MEMS structure. Adjusting the processing may include reducing a gain of the second MEMS structure.

A method for providing a wide band frequency response by electronic circuitry is also described. The method includes capturing a first signal by a first MEMS structure that exhibits a first frequency response in a voice frequency range. The method also includes capturing a second signal by a second MEMS structure that exhibits a second frequency response in an ultrasound frequency range. A combination of the first frequency response and the second frequency response achieves a target frequency response in a combined frequency range. The method further includes combining the first signal and the second signal.

A computer-program product for providing a wide band frequency response is also described. The computer-program product includes a non-transitory tangible computer-readable medium with instructions thereon. The instructions include code for causing electronic circuitry to capture a first signal by a first MEMS structure that exhibits a first frequency response in a voice frequency range. The instructions also include code for causing the electronic circuitry to capture a second signal by a second MEMS structure that exhibits a second frequency response in an ultrasound frequency range. A combination of the first frequency response and the second frequency response achieves a target frequency response in a combined frequency range. The instructions further include code for causing the electronic circuitry to combine the first signal and the second signal.

An apparatus for providing a wide band frequency response is also described. The apparatus includes means for capturing a first signal. The means for capturing the first signal exhibits a first frequency response in a voice frequency range. The apparatus also includes means for capturing a second signal coupled to the means for capturing the first signal. The means for capturing the second signal exhibits a second frequency response in an ultrasound frequency range. A combination of the first frequency response and the second frequency response achieves a target frequency response in a combined frequency range.

DETAILED DESCRIPTION

Figure 1:
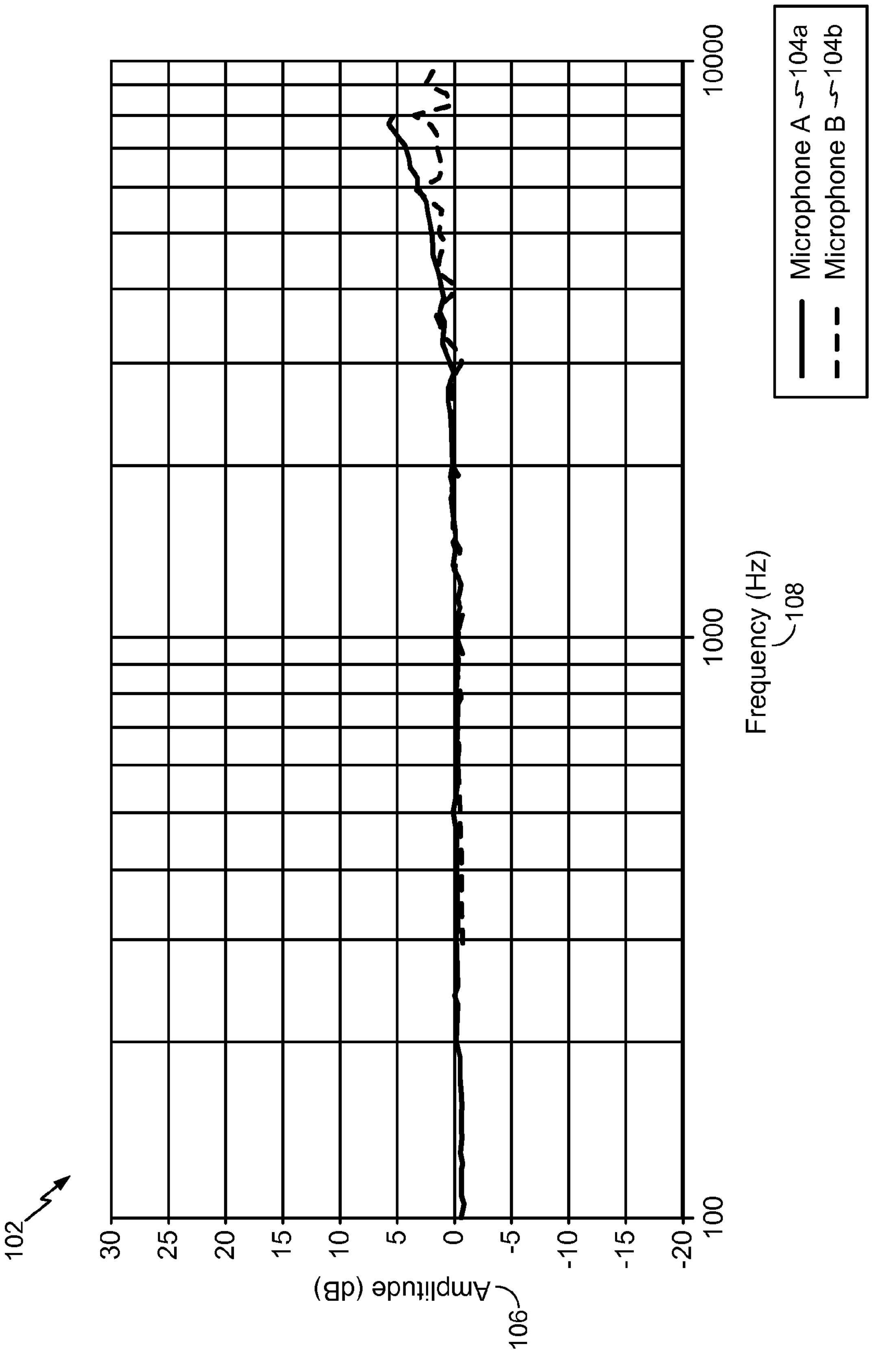
FIG. 1 includes a graph illustrating examples of frequency responses of microphones in a frequency range of 100 hertz (Hz) to 10 kilohertz (kHz)

The systems and methods described herein may utilize multiple microelectromechanical systems (MEMS) microphones for a wide band frequency response. One problem is that microphone performance may not cover audio to ultrasound frequencies well, resulting in an unwanted response (e.g., a response that does not achieve a target frequency response or a response outside of a predetermined amplitude range(s) over one or more frequency ranges) that can negatively affect the performance of audio and ultrasound use cases. For example, an unwanted response (e.g., non-flat response) may need to be corrected in a digital signal processor (DSP) for audio and ultrasound algorithm use. Additionally, high level peaks in the response may reduce dynamic range and cause phase shifts, which may degrade algorithm performance. Using multiple MEMS structures in accordance with the systems and methods disclosed herein (within a single microphone, for example) may help to ameliorate or solve these problems. In particular, an improved microphone frequency response may be obtained using multiple MEMS structures within a single microphone. For example, one of the MEMS structures may be tuned (e.g., optimized) for a frequency range (e.g., an audio band) up to 20 kilohertz (kHz), while another MEMS structure may be tuned (e.g., optimized) for a frequency range between 20 kHz to 100 kHz. In some configurations, the output from these structures may be recombined and converted to digital using a sigma delta analog-to-digital converter.

Some known approaches do not specifically address the frequency response issue for mobile applications, since they previously only used voice and audio bandwidth. For example, an existing single MEMS microphone that was designed for audio could be leveraged while attempting to increase sensitivity in the ultrasound band. For instance, some high performance reference microphones can measure out to approximately 100 kHz. Additionally, some ultrasound sensors designed for 40 kHz and 60 kHz are common but do not operate in the audio band. It should be noted that some dual MEMS have been introduced to address high sound pressure level (SPL). Dual MEMS can also be used to increase sensitivity.

However, one aspect of the systems and methods disclosed herein uses multiple (e.g., dual) MEMS sensors to improve (e.g., optimize) performance for specific frequency bands. For instance, microphone frequency response may be adjusted by using multiple MEMS structures within a single microphone. In some configurations, the captured signals may be recombined electrically. This could be considered similar to designing a two-way loudspeaker, but in the other direction.

One optional aspect of the invention addresses ultrasound microphone intermodulation distortion (IMD). For example, the systems and methods disclosed herein present an approach for reducing IMD in wide band microphones. One problem is that microphones with a wide bandwidth supporting both ultrasound up to 96 kHz and audio below 24 kHz may have problems with audible IMD due to ultrasound. One example scenario is where a user is making a Skype call while using an ultrasound pen for note taking. When the pen is active, the person at the far end may hear a buzz as a result of the IMD created by the microphone. This may be the most noticeable when the near-end talker is quiet and the IMD is not masked by voice.

The IMD in microphones is a result of the MEMS in combination with a high impedance analog input. By separating the frequency bands between two MEMS sensors, for example, the IMD can be removed or greatly reduced by filtering with a high pass filter.

This problem was not addressed by microphones that only support the audio band. In that case, the frequency response may be limited to 20 kHz or less. However, this could be a bigger problem when ultrasound is used for new applications. While existing microphones do not generally target ultrasound, they tend to have some response in this band that could cause a problem. For example, microphone suppliers currently target distortion performance based on audio band (e.g., <24 kHz) requirements only. This is done by focusing on creating a single MEMS structure and interface that is very linear in the audio band.

However, expanding the bandwidth to 96 kHz makes this problem very challenging. By separating the components that create the distortion in accordance with the systems and methods disclosed herein, the requirements for each can be relaxed through filtering techniques.

Another optional aspect of the systems and methods disclosed herein involves controlling one or more signal levels (caused by an intended signal and/or an interfering signal, for instance). For example, the systems and methods disclosed herein may utilize ultrasound microphone automatic gain control (AGC).

One problem is that ultrasound-enabled microphones may become saturated with an interfering ultrasound signal. For example, conference room proximity sensors can saturate ultrasound enabled microphones. Many proximity sensors in meeting rooms use ultrasound transmitters that operate in the 25 kHz to 60 kHz frequency range. This signal, in some cases, is very loud and can saturate an analog-to-digital converter (ADC) in microphones that use a single sensor.

For frequency bands split between two MEMS sensors, the systems and methods disclosed herein may utilize an AGC approach to detect the loud proximity sensor signal and to determine how to obtain improved performance. For example, the high frequency MEMS may be turned off so that there is no impact to audio performance. In another example, the frequency response of the high frequency MEMS may be adjusted. In yet another example, the gain of the high frequency MEMS may be reduced.

This problem was not addressed by microphones that only support the audio band. In that case, the frequency response may be limited to 20 kHz or less. However, this could be a bigger problem when ultrasound is used for new applications. While existing microphones do not generally target ultrasound, they tend to have some response in this band that could cause a problem. Ultrasound applications are an emerging technology in the mobile computing space. Accordingly, the systems and methods disclosed herein provide a novel solution to the problem.

Other possible solutions include reducing the sensitivity of the microphone, although this may degrade audio performance. High sound pressure level (SPL) microphones may be able to address this by providing more headroom to prevent saturation. A known high SPL microphone targets audio applications such as recording a concert. If this is extended to the ultrasound band, then audio would still work in the presence of high level ultrasound. However, there would be a noticeable increase in the audio noise floor for no apparent reason as far as the user can tell.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 includes a graph 102 illustrating examples of frequency responses of microphones 104*a-b* in a frequency range of 100 hertz (Hz) to 10 kilohertz (kHz). The horizontal axis of the graph 102 is illustrated in frequency (Hz) 108 and the vertical axis of the graph 102 is illustrated in amplitude (decibels (dB)) 106. The frequency range between 100 Hz and 8 kHz may be referred to as a "voice frequency range," since many of the frequency components of the human voice occur within this frequency range. Voice band microphones may be designed to capture voice signals occurring within the voice frequency range.

As illustrated in FIG. 1, the frequency responses of the microphones 104*a-b* are nearly flat between 100 Hz and 8 kHz. For voice applications, it may be desirable to have frequency response amplitudes that meet a target frequency response (e.g., with less than ±2 dB amplitude variation from 0 dB, a "flat" response, etc.) between 100 Hz and 8 kHz.

However, there is a problem with using known audio microphones for ultrasound applications. For example, ultrasound applications in mobile devices may utilize ultrasound signals at frequencies up to 80 kHz. However, known microphones are typically only designed to meet a target frequency response up to 8 or 20 kHz. For example, a target frequency response may be achieved when amplitude variation is restricted within a certain amplitude range over one or more frequency ranges.

Figure 2:
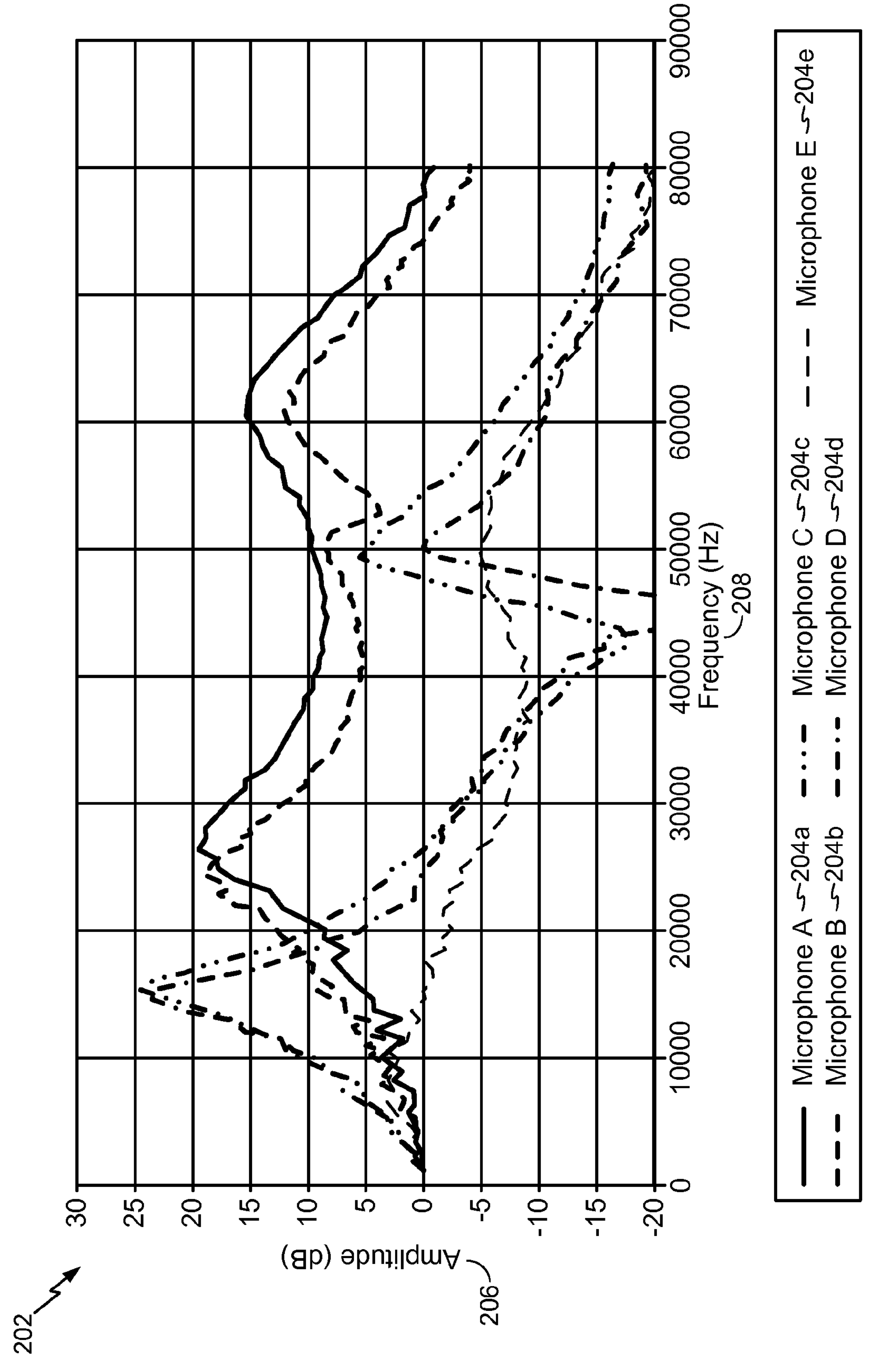
FIG. 2 includes a graph illustrating examples of frequency responses of microphones in a frequency range of 0 Hz to 80 kHz.

FIG. 2 includes a graph 202 illustrating examples of frequency responses of microphones 204*a-e* in a frequency range of 0 Hz to 80 kHz. The horizontal axis of the graph 202 is illustrated in frequency (Hz) 208 and the vertical axis of the graph 202 is illustrated in amplitude (dB) 206. FIG. 2 illustrates frequency responses of known microphones above 10 kHz. Above 10 kHz, these responses can vary by more than 50 dB in some cases.

Figure 3:
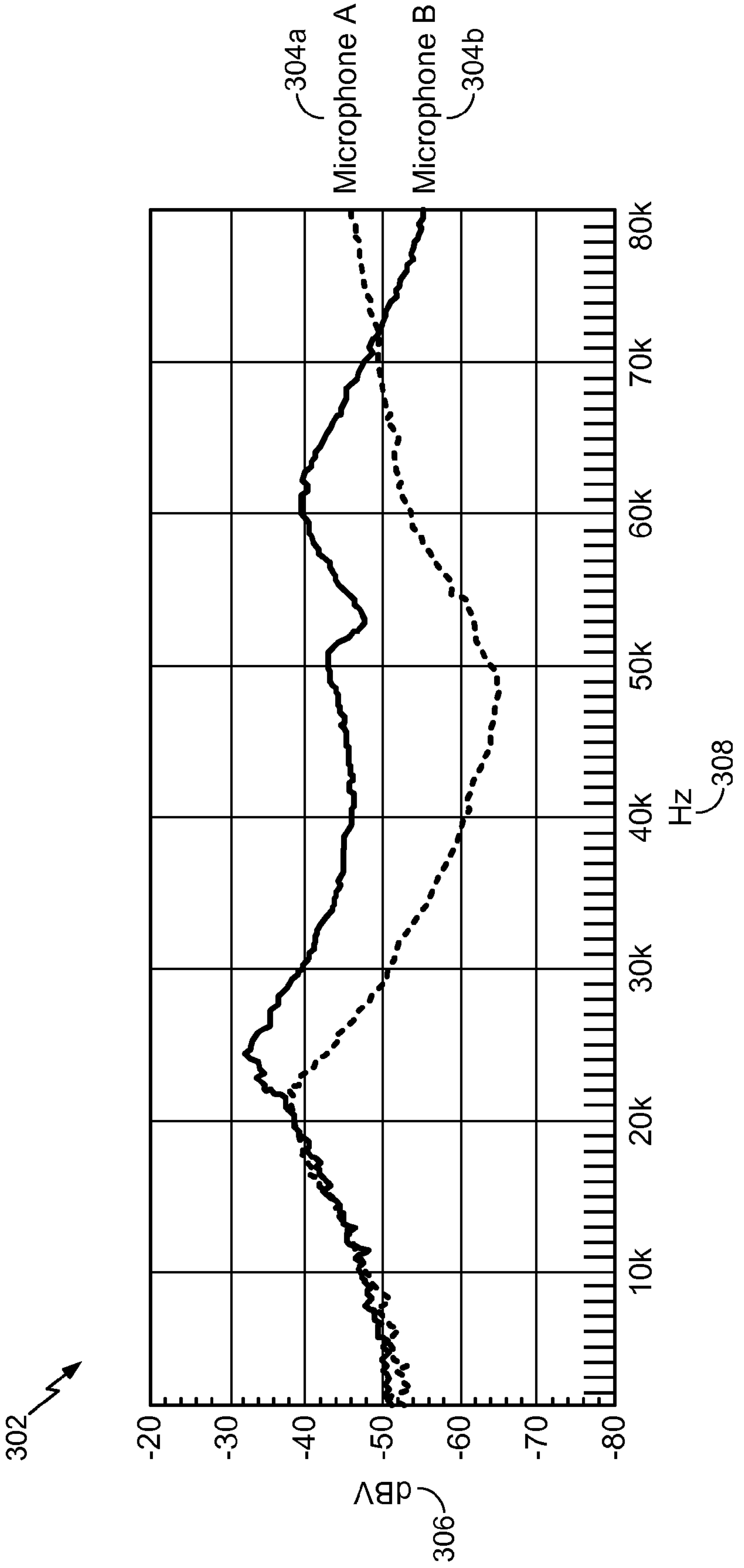
FIG. 3 includes a graph illustrating more examples of frequency responses of microphones in a frequency range of 0 Hz to 80 kHz.

FIG. 3 includes a graph 302 illustrating more examples of frequency responses of microphones 304*a-b* in a frequency range of 0 Hz to 80 kHz. The horizontal axis of the graph 302 is illustrated in frequency (Hz) 308 and the vertical axis of the graph 302 is illustrated in decibels relative to 1 volt (dBV) 306. FIG. 3 illustrates two examples of microphone frequency responses that exhibit responses with a small amount of variation in the 0-10 kHz range and a large amount of variation in the 10-80 kHz range.

Figure 4:
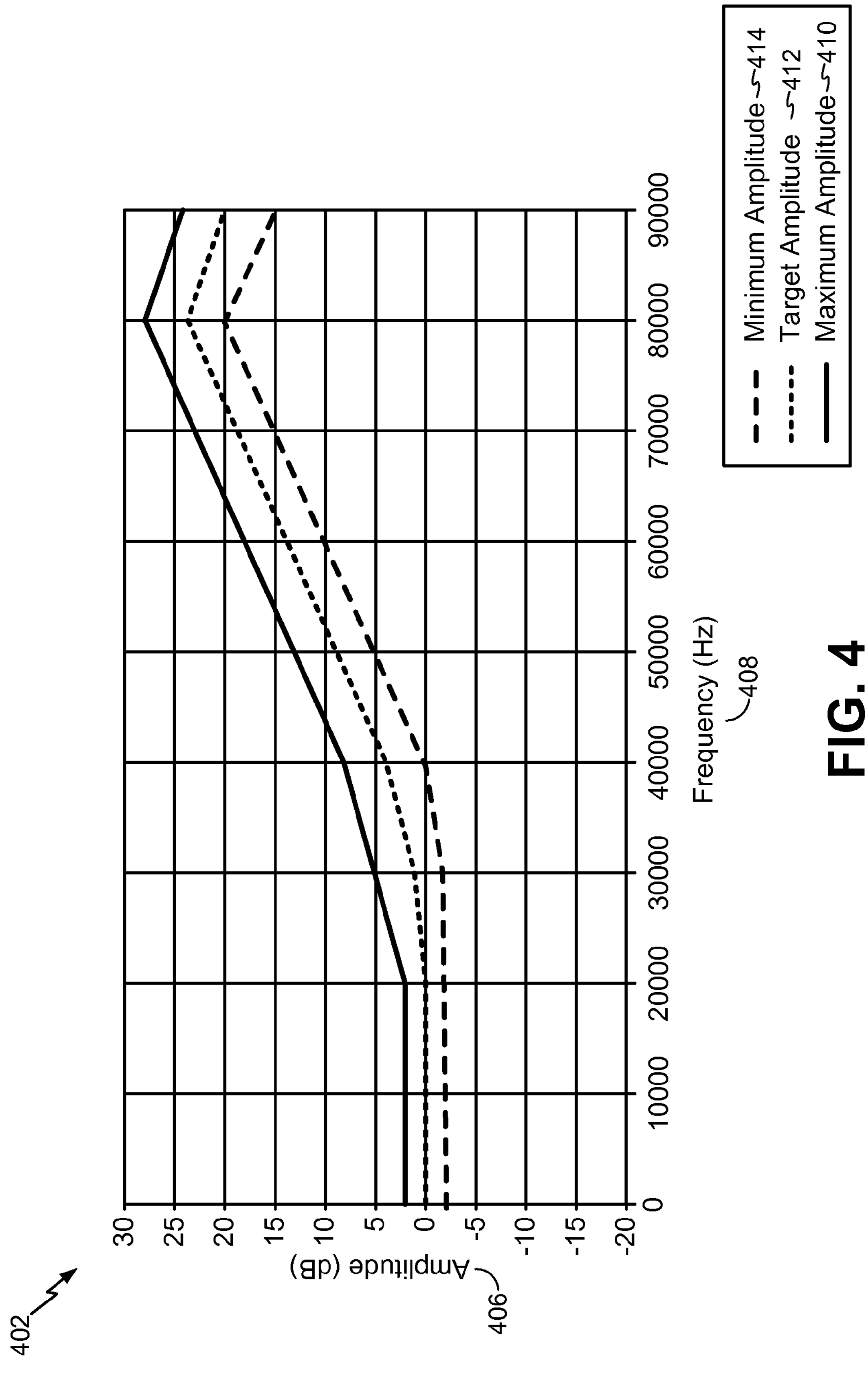
FIG. 4 includes a graph illustrating one example of a target frequency response for voice and/or ultrasound applications.

FIG. 4 includes a graph 402 illustrating one example of a target frequency response for voice and/or ultrasound applications. The horizontal axis of the graph 402 is illustrated in frequency (Hz) 408 and the vertical axis of the graph 402 is illustrated in amplitude (dB) 406. A target frequency response may be defined based on a minimum amplitude, a maximum amplitude and/or a target amplitude. In particular, the graph 402 illustrates a minimum amplitude 414, a maximum amplitude 410 and a target amplitude 412 of a target frequency response of a microphone for voice and ultrasound applications. In this example, a microphone would achieve the target frequency response if it exhibited a response in between the minimum amplitude 414 and the maximum amplitude 410.

It should be noted that the target frequency response illustrated in FIG. 4 is not a flat response in the ultrasound frequency range between 20 kilohertz (kHz) and 100 kHz. For example, a target frequency response may include a sloped frequency response (as illustrated in FIG. 4), a flat frequency response or a combination thereof. For instance, the target frequency response shown in FIG. 4 may be one example of a target frequency response for digital microphones with 4th order noise shaping. The systems and methods disclosed herein may be applied to provide a sensitivity that achieves the target frequency response illustrated. However, it should be noted that an analog microphone or a different digital microphone might be designed or adjusted to achieve a different target response. For instance, one example of a target frequency response that includes a flat response is illustrated in FIG. 5.

Figure 5:
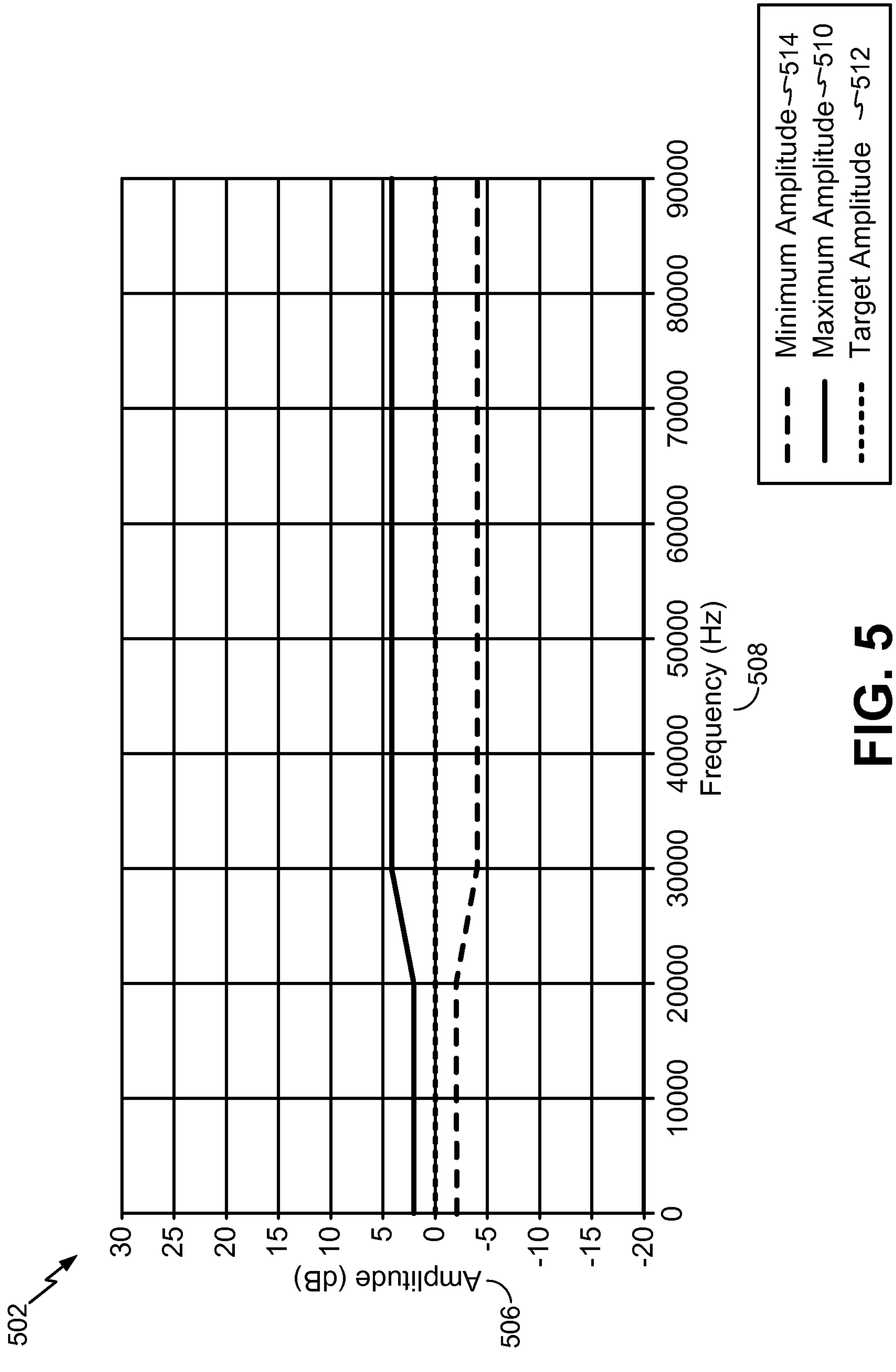
FIG. 5 includes a graph illustrating another example of a target frequency response.

FIG. 5 includes a graph 502 illustrating another example of a target frequency response. The horizontal axis of the graph 502 is illustrated in frequency (Hz) 508 and the vertical axis of the graph 502 is illustrated in amplitude (dB) 506. In particular, the graph 502 illustrates a minimum amplitude 514, a maximum amplitude 510 and/or a target amplitude 512 of a target frequency response of a microphone for voice and/or ultrasound applications. In this example, a microphone would achieve the target frequency response if it exhibited a response in between the minimum amplitude 514 and the maximum amplitude 510. The target frequency response illustrated allows smaller variations (e.g., ±2 dB from 0 dB) under 20 kHz and larger variations (e.g., ±4 dB from 0 dB) in the ultrasound frequency range.

Figure 6:
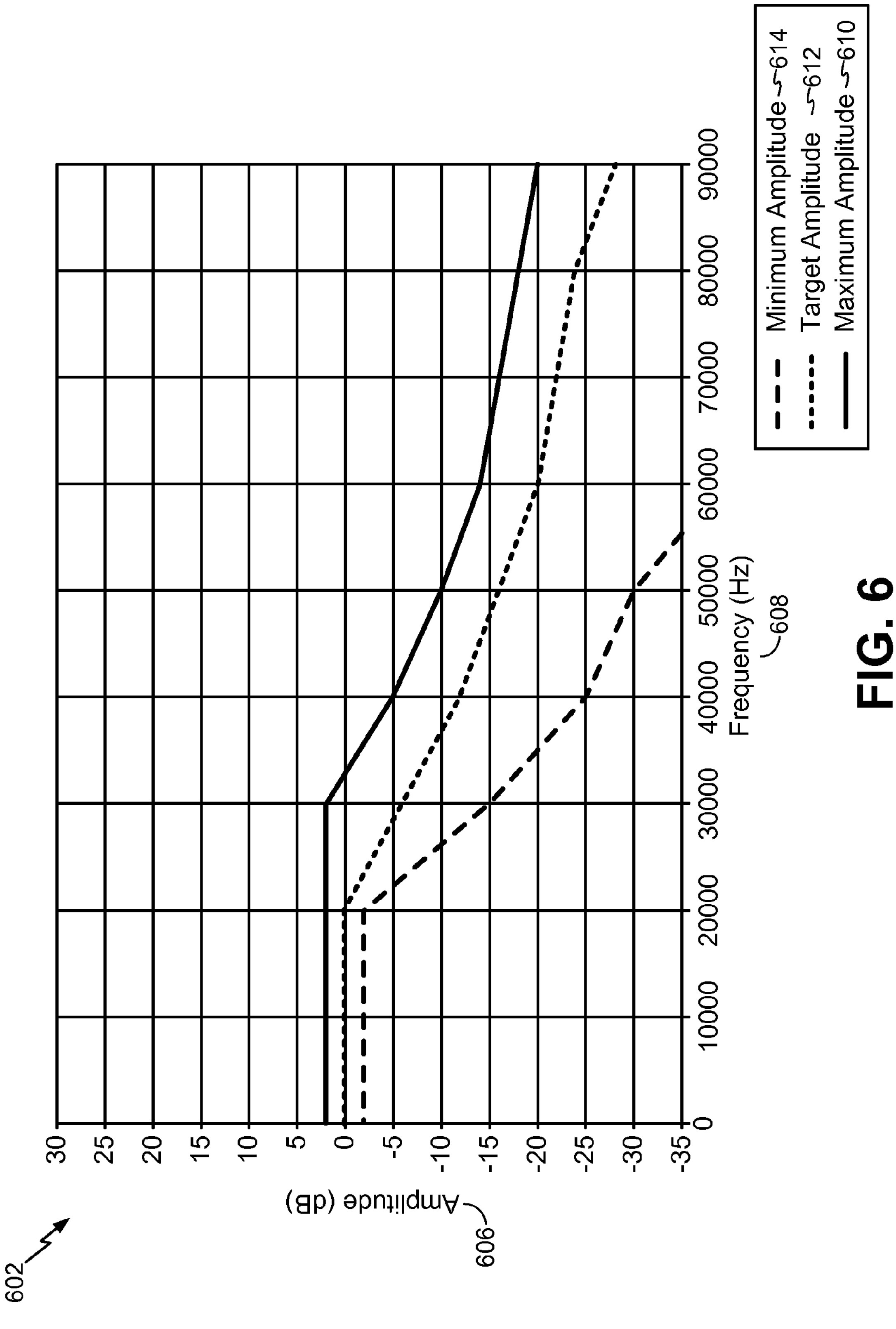
FIG. 6 includes a graph illustrating another example of a target frequency response for audio applications.

FIG. 6 includes a graph 602 illustrating another example of a target frequency response for audio applications. The horizontal axis of the graph 602 is illustrated in frequency (Hz) 608 and the vertical axis of the graph 602 is illustrated in amplitude (dB) 606. In particular, the graph 602 illustrates a minimum amplitude 614, a maximum amplitude 610 and/or a target amplitude 612 of a target frequency response of a microphone for audio applications. In this example, a microphone would achieve the target frequency response if it exhibited a response in between the minimum amplitude 614 and the maximum amplitude 610. As can be observed in FIGS. 4 and 6, frequency response requirements may diverge for audio applications and ultrasound applications.

Figure 7:
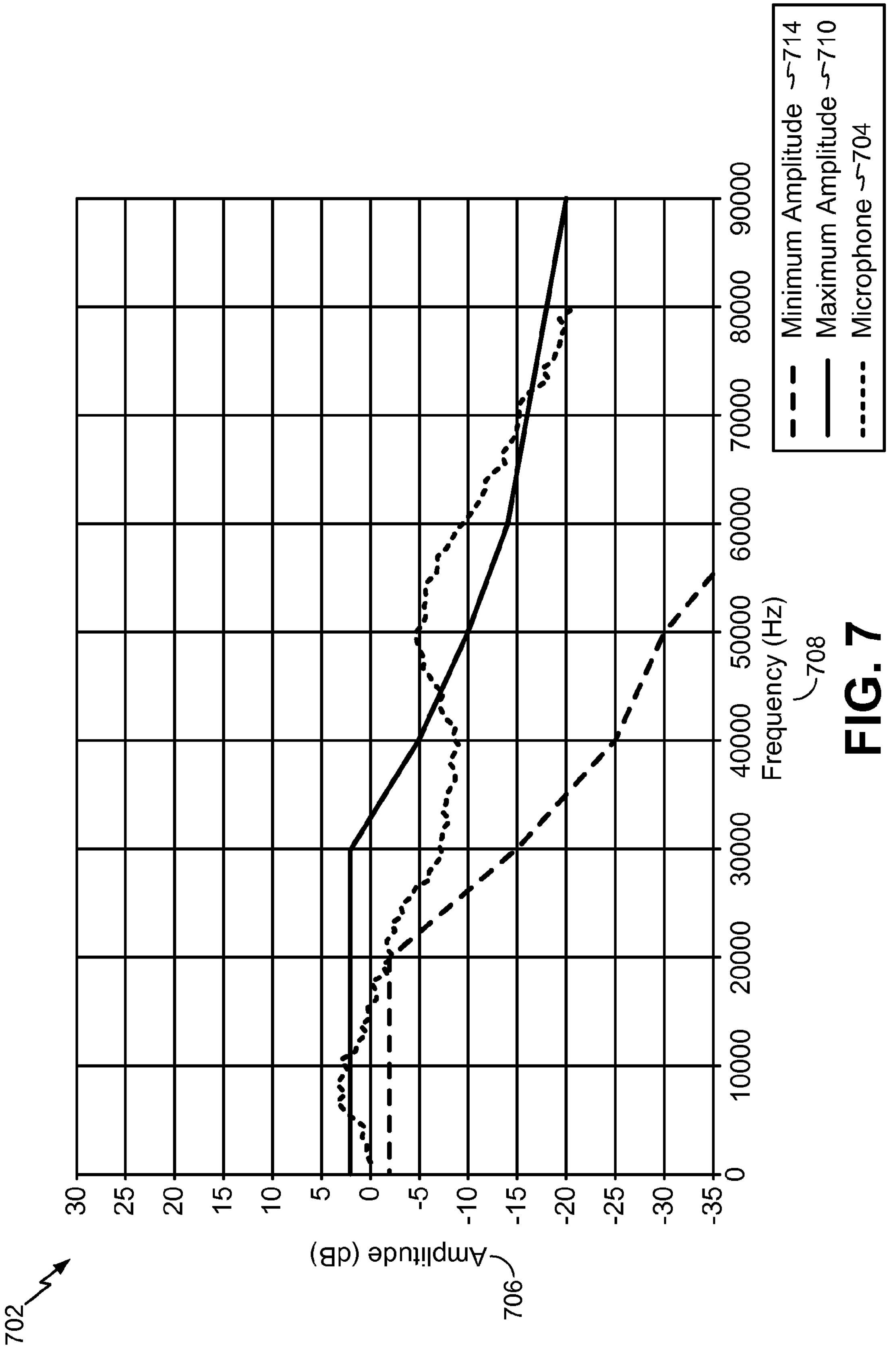
FIG. 7 includes a graph illustrating another example of a frequency response of a known microphone.

FIG. 7 includes a graph 702 illustrating another example of a frequency response of a known microphone 704. The horizontal axis of the graph 702 is illustrated in frequency (Hz) 708 and the vertical axis of the graph 702 is illustrated in amplitude (dB) 706. The microphone 704 frequency response illustrated in FIG. 7 is shown relative to the target frequency response described in connection with FIG. 6. As can be observed, the microphone 704 frequency response varies outside of the minimum amplitude 714 and the maximum amplitude 710 of the target frequency response.

Figure 8:
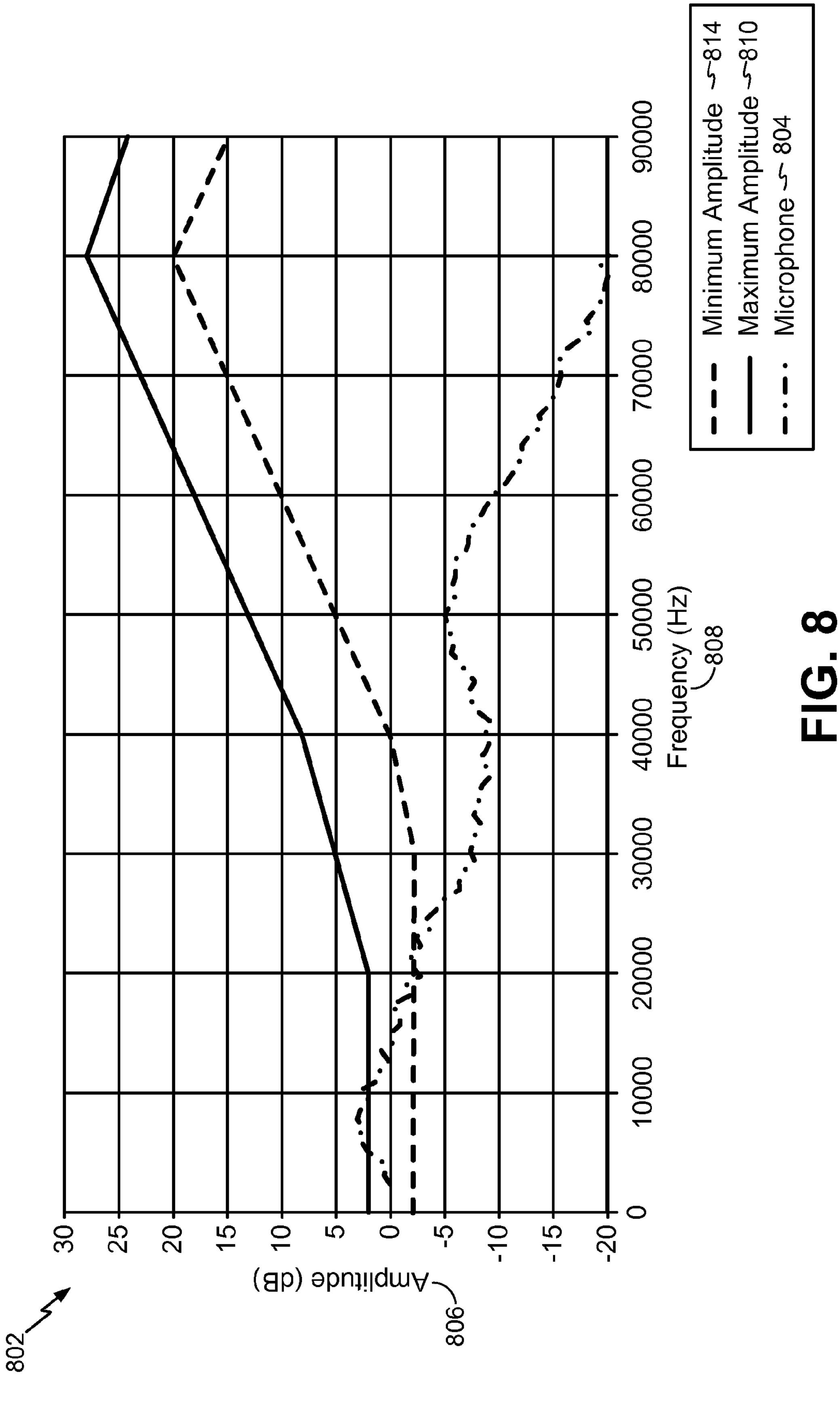
FIG. 8 includes a graph illustrating an example of a frequency response of a known microphone and a target frequency response.

FIG. 8 includes a graph 802 illustrating an example of a frequency response of a known microphone 804 and a target frequency response. The horizontal axis of the graph 802 is illustrated in frequency (Hz) 808 and the vertical axis of the graph 802 is illustrated in amplitude (dB) 806. In particular, FIG. 8 illustrates the frequency response of a microphone 804 in comparison with a target frequency response. As illustrated in the graph 802, the microphone 804 does not achieve the target frequency response. A microphone does not achieve the target frequency response if its frequency response varies outside of a minimum amplitude and/or a maximum amplitude in accordance with the target frequency response. As can be observed, the microphone 804 frequency response varies outside of the maximum amplitude 810 and the minimum amplitude 814 (in the ultrasound frequency range). It should be noted that electrical signal filtering techniques may be utilized to enhance ultrasound performance. While this may work to an extent, resonance in the ultrasound frequency range still presents a problem.

Figure 9:
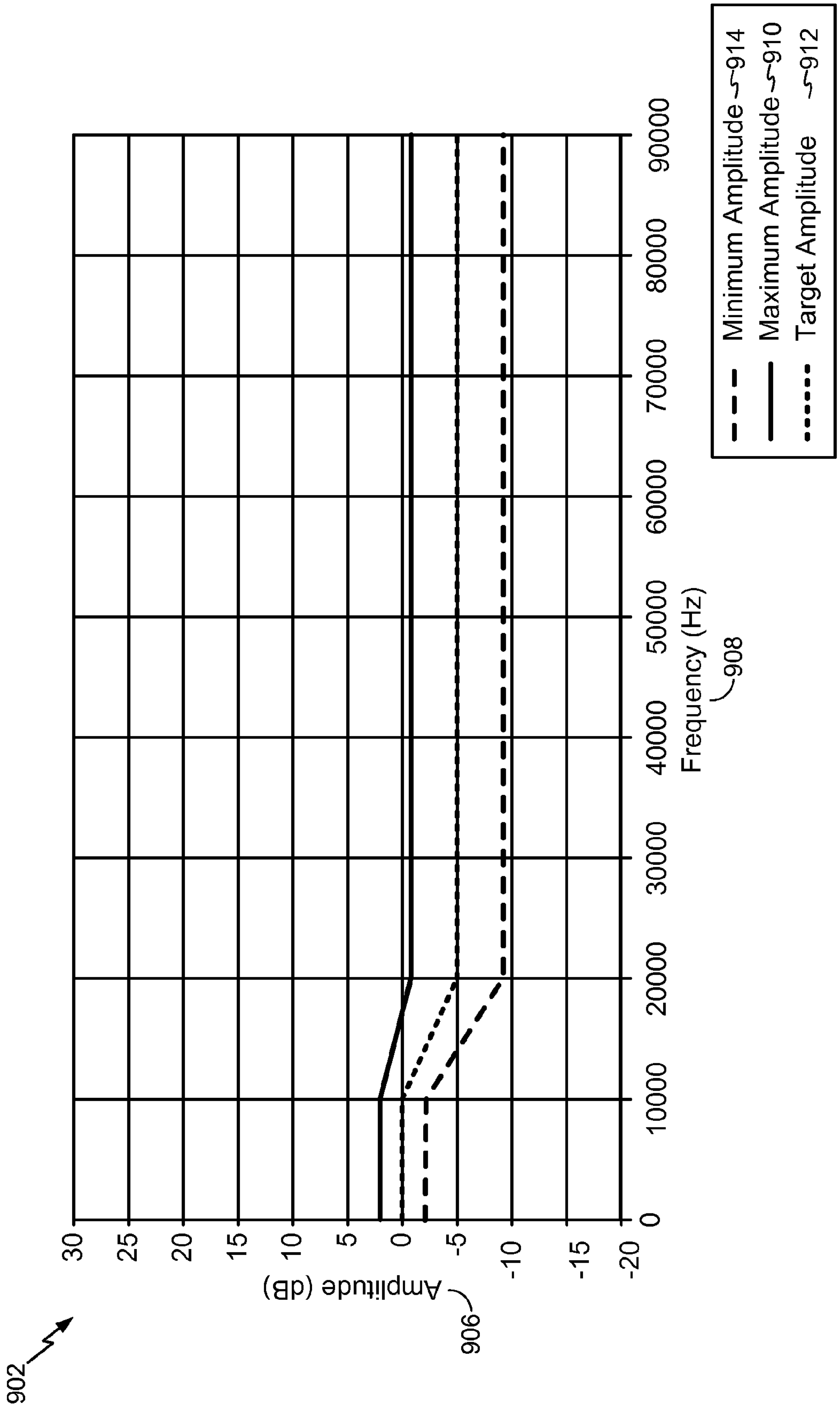
FIG. 9 includes a graph illustrating another example of a target frequency response.

FIG. 9 includes a graph illustrating another example of a target frequency response. The horizontal axis of the graph 902 is illustrated in frequency (Hz) 908 and the vertical axis of the graph 902 is illustrated in amplitude (dB) 906. In particular, the graph 902 illustrates a minimum amplitude 914, a maximum amplitude 910 and/or a target amplitude 912 of a target frequency response of a microphone for audio and/or ultrasound applications. In this example, a microphone would achieve the target frequency response if it exhibited a response in between the minimum amplitude 914 and the maximum amplitude 910. As can be observed in FIG. 9, the target frequency response includes an attenuated frequency response in the ultrasound frequency range.

One part of the problem in achieving a target frequency response may involve acoustics and may not be an electrical issue. In some cases, there may be diverging requirements for the audio frequency range (<20 kHz) and the ultrasound frequency range (20 kHz to 100 kHz). Different approaches could be used to address these problems. Some options are provided as follows. In one option, two microphones may be used: one for ultrasound and one for audio. In this option, a desirable frequency response may be obtained. However, manufacturers may need to source two different parts. Furthermore, this may lead to additional cost and may require more input/output (I/O) capabilities for an interface. In this option, known microphones would still need to be improved for better audio and/or ultrasound performance.

In another option, a known microphone could be selected that comes closest to achieving the target frequency response for both audio and ultrasound bands. This option may provide a one-part solution with minimal effort. However, performance will vary significantly and audio devices may not be guaranteed to work well at the desired frequencies.

In another option, microphone manufacturers could be encouraged to provide an improved solution. This option could lead to improve control and ultrasound performance. However, this option may still does not meet target performance, and in some cases only electrical changes may be made to get closer to the target performance. For instance, this option may still not meet audio requirements. For instance, a mode could be utilized that decreases high-frequency sensitivity, although this may still not be low enough.

Yet another option includes utilizing two MEMS diaphragms (in a single microphone, for example), where one MEMS diaphragm is designed for audio and the other MEMS diaphragm is designed for ultrasound. In this option, a target frequency response may be achieved. This option also enables using mixed modes or a single mode based on the application. This option may allow addressing the problem with acoustics.

Figure 10:
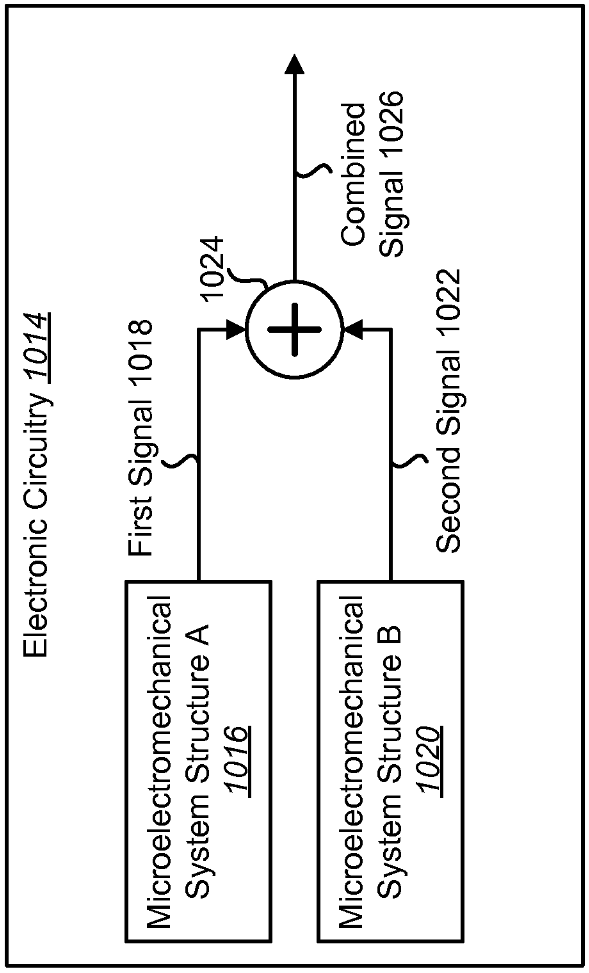
FIG. 10 is a block diagram illustrating one configuration of electronic circuitry in accordance with the systems and methods disclosed herein.

FIG. 10 is a block diagram illustrating one configuration of electronic circuitry 1014 in accordance with the systems and methods disclosed herein. Examples of the electronic circuitry 1014 include integrated circuits, microphones, printed circuit boards, application specific integrated circuits (ASICs), etc. In some configurations, the electronic circuitry 1014 may be an electronic device or may be integrated into an electronic device, such as a microphone, telephone, cellular phone, smartphone, tablet device, voice recorder, digital camera, still camera, camcorder, headset (e.g., Bluetooth headset, wired headset, etc.), gaming system, desktop computer, laptop computer, television, monitor, appliance, vehicle dashboard electronic system, etc.

The electronic circuitry 1014 includes microelectromechanical system (MEMS) structure A 1016 and MEMS structure B 1020. In some configurations, the MEMS structures 1016, 1020 may include one or more components with sizes in a micrometer range (e.g., between 0.001 millimeter and 1 millimeter (mm)). For example, one or more of the MEMS structures 1016, 1020 may have diaphragms that are approximately 0.5 mm in size. In general, the MEMS structures 1016, 1020 (e.g., MEMS sensors) capture sound signals (e.g., generate electrical signals based on acoustic sound signals). In other words, each of the MEMS structures 1016, 1020 may be transducers that convert acoustic sound signals (e.g., waves, oscillations, etc.) to electrical signals. In some configurations, the MEMS structures 1016, 1020 include diaphragms or actuators for converting acoustic sound signals into electrical signals. For example, each of the MEMS structures 1016, 1020 may include a capacitive diaphragm that responds to sound (e.g., pressure oscillations of a medium). In some configurations, each of the MEMS structures 1016, 1020 may be implemented (e.g., etched) in silicon and may be square or rectangular in shape with a circular diaphragm (in the center, for example). As sound interacts with the diaphragm, the capacitance between the diaphragm and a plate (e.g., back plate) changes. These changes in capacitance may be utilized to generate an electrical signal. In some configurations, the diaphragm and/or the back plate may have one or more holes that allow air flow (through the back plate, for example).

As used herein, the term "sound" may refer to one or more mechanical waves (e.g., oscillations in pressure) transmitted through a medium (e.g., air). Sound that is audible to humans may typically occur within a frequency range of 12 Hz to 20 kHz. In some configurations of the systems and methods disclosed herein, an "audio frequency range" is defined as occurring at frequencies below 20 kHz (e.g., $0\ Hz<f_{audio}<20$ kHz), a "voice frequency range" is defined as occurring between 100 Hz-8 kHz (e.g., $100\ Hz \leq f_{voice} \leq 8$ kHz) and an "ultrasound frequency range" is defined as occurring between 20-100 kHz (e.g., $20\ kHz \leq f_{ultrasound} \leq 100$ kHz). For example, the "voice frequency range" of 100 Hz to 8 kHz may be utilized and frequencies below 100 Hz may be attenuated (e.g., filtered) to remove unwanted noise. It should be noted, however, that wideband voice may be specified down to 50 Hz and a voice signal in general may include frequencies down to 0 Hz. However, some of these lower frequencies (e.g., below 100 Hz or 50 Hz) may not be encoded and/or transmitted in some voice call applications. Accordingly, in other configurations, the "voice frequency range" may be considered to include a range of 0 Hz-8 kHz or 50 Hz-8 kHz.

A flat frequency response may vary within a range of amplitudes from a target amplitude or a target value over a certain frequency range (e.g., in the voice frequency range, in the audio frequency range, in the ultrasound frequency range, in a subset of any of the foregoing or in or over any combination thereof). One example of a "flat frequency response" may vary within ±2 dB from a target amplitude (e.g., from a target value such as 0 dB) over the voice frequency range. Another example of a "flat frequency response" may vary within ±4 dB from a target amplitude (e.g., a target value such as 0 dB, 2 dB, −2 dB, etc.) over the ultrasound frequency range. It should be noted that other amplitude ranges may be specified.

A "sloped frequency response" may vary within an amplitude range from an increasing and/or decreasing target amplitude over a certain frequency range (e.g., in the voice frequency range, in the audio frequency range, in the ultrasound frequency range, in a subset of any of the foregoing or in or over any combination thereof). One example of a sloped frequency response may vary within ±4 dB from a target amplitude that increases by 22 dB between 30 kHz and 80 kHz as illustrated in FIG. 4.

It should be noted that the range of amplitudes of a target frequency response may vary over a certain frequency range. For example, the range of amplitudes in the target frequency response expands from ±2 dB at 20 kHz to ±4 dB at 30 kHz (and expands above 80 kHz) as illustrated in FIG. 4.

MEMS structure A 1016 may be designed to capture voice frequency range signals. MEMS structure A 1016 may exhibit a first frequency response in a first (e.g., voice) frequency range. For example, MEMS structure A 1016 may exhibit a flat and/or sloped frequency response in the voice frequency range. MEMS structure B 1020 may be designed to capture ultrasound frequency range signals. MEMS structure B 1020 may exhibit a second frequency response in a second (e.g., ultrasound) frequency range. For example, MEMS structure B 1020 may exhibit a flat and/or sloped frequency response in the ultrasound frequency range.

As described above, many known microphones may not achieve particular target frequency responses over one or more frequency ranges (e.g., over the voice frequency range and the ultrasound frequency range). One of the benefits of the systems and methods disclose herein is that frequency responses in multiple ranges may be decoupled. This allows separate design and tuning in different frequency ranges. The frequency responses in the different frequency ranges may be combined to produce a combined frequency response that achieves a target frequency response in the combined frequency range. For example, the frequency response of MEMS structure A 1016 in the voice frequency range (or in the wider audio frequency range, for example) may be effectively decoupled from the frequency response of MEMS structure B 1020 in the ultrasound frequency range. Accordingly, MEMS structure A 1016 and MEMS structure B 1020 may have separate frequency responses. The frequency responses of MEMS structure A 1016 and MEMS structure B 1020 may be combined to achieve a target frequency response in the combined frequency range. For example, MEMS structure A 1016 and MEMS structure B 1020 may be coupled by the summer 1024 in order to combine the respective frequency responses. Thus, multiple MEMS structures may be combined in a single microphone that exhibits a combined frequency response that achieves a target frequency response in the combined frequency range. The "combined frequency range" may include frequency ranges corresponding to each of the ranges of the frequency responses for each MEMS structure.

When MEMS structures achieve a target frequency response in the combined frequency range, this may mean that the target frequency response is achieved at least in each of the frequency ranges specified. Thus, a target frequency response may be achieved in one or more continuous or discontinuous frequency ranges. For example, the systems and methods disclosed herein may enable a flat frequency response in the audio frequency range and a flat frequency response in the ultrasound frequency range. In another example, the systems and methods disclosed herein may enable a flat frequency response in the voice frequency range and a sloped response in the ultrasound frequency range. Accordingly, the systems and methods disclosed herein may provide more flexibility in separately controlling frequency responses in multiple (e.g., two) frequency ranges or bands.

MEMS structure A 1016 captures a first signal 1018. For example, MEMS structure A 1016 converts an acoustic first signal into an electrical first signal 1018. MEMS structure B 1020 captures a second signal 1022. For example, MEMS structure B 1020 converts an acoustic second signal into an electrical second signal 1022.

It should be noted that each of the MEMS structures 1016, 1020 may be designed in accordance with one or more parameters that may affect the frequency response. Some of these parameters may include diaphragm size and shape, distance to a back plate, diaphragm stiffness, hole size and location in the diaphragm (if any), hole size and location in the back plate (if any), back volume (e.g., chamber size behind the backplate, which may have a corresponding resonance), diaphragm-to-back plate spacing, port hole size, etc. For example, if a port hole for a microphone is too big, the microphone frequency response may not achieve a target frequency response. Accordingly, a smaller port hole size may be used in some configurations to achieve the target frequency response. In some configurations, MEMS structure A 1016 and MEMS structure B 1020 may share a back volume. Additionally or alternatively, MEMS structure A 1016 and MEMS structure B 1020 may share a port hole (e.g., a hole through which acoustic signals are received). In other configurations, MEMS structure A 1016 and MEMS structure B 1020 may have separated back volumes (e.g., a partition between a back volume corresponding to MEMS structure A 1016 and a back volume corresponding to MEMS structure B 1020). Additionally or alternatively, MEMS structure A 1016 and MEMS structure B 1020 may have separate port holes. The systems and methods disclose herein allow each of these parameters to be designed to obtain decoupled frequency responses between the MEMS structures 1016, 1020.

It should be noted that adding a port hole or changing port hole design may change microphone performance. In some cases, in may be possible to compensate for these variations using digital signal processing (DSP). However, one benefit of the systems and methods disclosed herein is to avoid a resonant peak in the frequency response (e.g., in the frequency range of the target frequency response), which provides a microphone that is more tolerant to port hole variation.

In some known approaches, multiple MEMS may be utilized to provide improved reception of different sound pressure level (SPL) ranges. For example, one MEMS may be designed to capture signals in the audio frequency range with a lower SPL while another MEMS may be designed to capture signals in the audio frequency range with a high SPL. However, these known approaches differ from the systems and methods disclosed herein in that both MEMS are designed to capture at least some signals in the audio frequency range. In accordance with the systems and methods disclosed herein, one MEMS structure (e.g., MEMS structure A 1016) may be designed to capture signals in the voice frequency range and/or the audio frequency range. However, another MEMS structure (e.g., MEMS structure B 1020) may be designed to capture signals in the ultrasound frequency range. In some configurations, MEMS structure B 1020 may be designed to avoid capturing signals in the voice frequency range and/or audio frequency range. For example, MEMS structure B 1020 may exhibit a frequency response that attenuates signals in the voice frequency range or the audio frequency range. Accordingly, MEMS structure A 1016 may have a decoupled or separate frequency response from the frequency response of MEMS structure B 1020. These decoupled frequency responses may be combined into a combined frequency response that achieves a target frequency response in the combined frequency range that includes frequency ranges for which each of the MEMS structures 1016, 1020 are designed.

In some configurations, the second signal 1022 may include one or more control or data signals. For example, a remote device may emit one or more signals in the ultrasound frequency range that may be utilized to track the remote device. In another example, a device may emit one or more signals in the ultrasound frequency range that may be received by the electronic circuitry 1014 (e.g., a microphone) and utilized to detect a proximity to a user or a user motion. The device that emits the one or more signals may be a separate device or may be a device that also includes the electronic circuitry 1014. In yet another example, a device that includes the electronic circuitry 1014 may emit one or signals in the ultrasound frequency range that may be utilized to determine an acoustic channel response. In yet another example, information may be transmitted to a device that includes the electronic circuitry 1014 via one or more ultrasound signals. Accordingly, the electronic circuitry 1014 may receive the one or more control or data signals in the ultrasound frequency range. Thus, it may be beneficial to achieve a target frequency response in the ultrasound frequency range in order to enable improved reception of the one or more control and/or data signals in the ultrasound frequency range.

MEMS structure B 1020 may be coupled to MEMS structure A 1016. As used herein, the term “couple” and variations thereof denote a direct or indirect connection (e.g., an electrical path). For example, MEMS structure B 1020 may be directly coupled to MEMS structure A 1016 without any intervening component. In another example, MEMS structure B 1020 may be indirectly coupled to MEMS structure A 1016 through one or more intervening components. In the block diagrams provided in the Figures, arrows or lines may denote couplings. A coupling may be implemented as an electrical path. Examples of couplings may include conductive lines, vias and/or wires, etc.

In some configurations, MEMS structure A 1016 and MEMS structure B 1020 may be implemented in a single unit or package. In other configurations, MEMS structure A 1016 and MEMS structure B 1020 may be implemented as separate units or packages.

In some configurations, the electronic circuitry 1014 may optionally include or be coupled to additional circuitry. For example, the electronic circuitry 1014 may include a summer 1024. In other examples, the summer 1024 may be implemented on a separate circuit. The summer 1024 may be implemented as a summing amplifier in some implementations. MEMS structure A 1016 and MEMS structure B 1020 may be coupled to the summer 1024. The first signal 1018 and the second signal 1022 may be provided to the summer 1024. The summer 1024 may combine (e.g., sum) the first signal 1018 and the second signal 1022 to generate a combined signal 1026.

It should be noted that in some configurations, the entire electronic circuitry 1014 may be a microphone. In other configurations, a subset of the electronic circuitry 1014 (e.g., only MEMS structure A 1016 and MEMS structure B 1020) may be considered a microphone.

In some configurations, the electronic circuitry 1014 may optionally include a high-pass filter that is coupled to MEMS structure B 1020. The high-pass filter may mitigate audio frequency range IMD caused by the second signal 1022.

In some configurations, the electronic circuitry 1014 may optionally include automatic gain control (AGC) circuitry. The AGC circuitry may be coupled to MEMS structure B 1020. The AGC circuitry may adjust processing in the ultrasound frequency range when a signal level meets or exceeds a threshold. For example, the AGC circuitry may deactivate MEMS structure B 1020, may adjust a frequency response of MEMS structure B 1020 and/or may reduce a gain of MEMS structure B 1020. It should be noted that the electronic circuitry 1014 may accordingly include none, one or both of the high-pass filter and the AGC circuitry.

It should be noted that the electronic circuitry 1014 and one or more of the functions thereof may be implemented in hardware or in a combination of hardware and software. For example, each of the functions performed by electronic circuitry described herein may be implemented in circuitry in some configurations. In other examples, one or more of the functions performed by electronic circuitry described herein may be implemented by a processor and instructions. For instance, filtering and/or AGC may be implemented by a processor with instructions that cause the processor to carry out the filtering and/or AGC functions.

Figure 11:
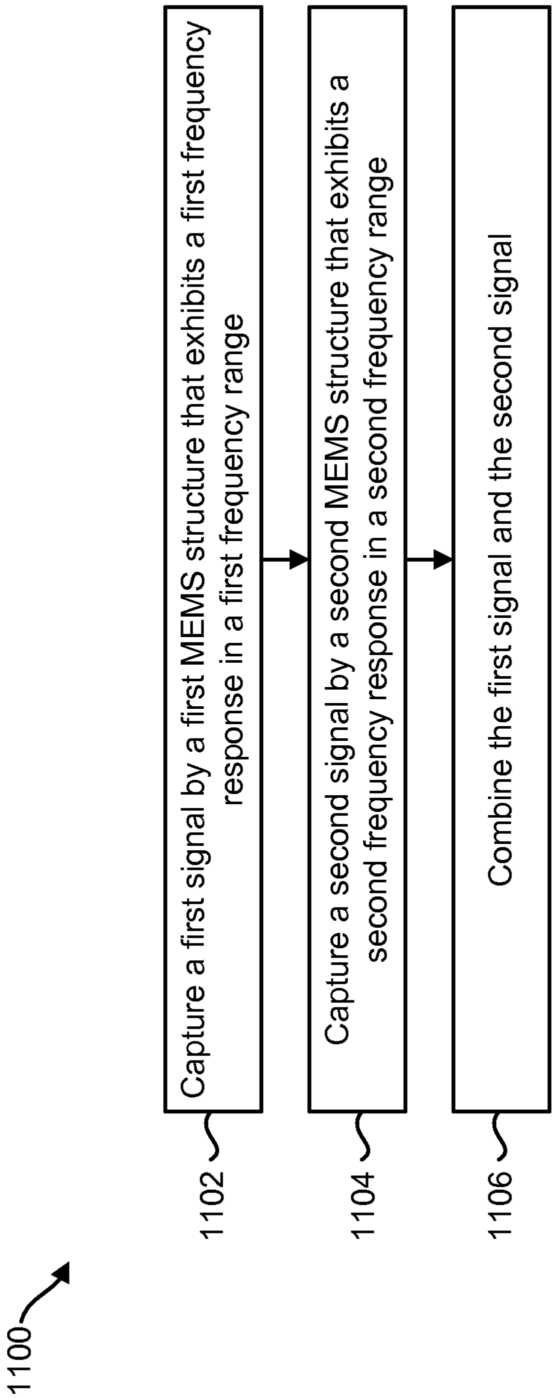
FIG. 11 is a flow diagram illustrating one configuration of a method for providing a wide band frequency response by electronic circuitry.

FIG. 11 is a flow diagram illustrating one configuration of a method 1100 for providing a wide band frequency response by electronic circuitry 1014. The electronic circuitry 1014 may capture 1102 a first signal 1018 by MEMS structure A 1016 that exhibits a first frequency response in a first (e.g., voice) frequency range. For example, MEMS structure A 1016 may convert an acoustic first signal to an electrical first signal 1018 as described above in connection with FIG. 10.

The electronic circuitry 1014 may capture 1104 a second signal 1022 by MEMS structure B 1020 that exhibits a second frequency response in a second (e.g., ultrasound) frequency range. For example, MEMS structure B 1020 may convert an acoustic second signal to an electrical second signal 1022 as described above in connection with FIG. 10. A combination of the first frequency response and the second frequency response may achieve a target frequency response in a combined frequency range as described above. In one example, the target frequency response may be flat (e.g., within ±2 dB from 0 dB) in the voice frequency range and flat (e.g., within ±4 dB from 0 dB) in the ultrasound frequency range. In another example, the target frequency response may be flat (e.g., within ±2 dB from 0 dB) in the voice frequency range (e.g., 100 Hz-8 kHz) and sloped in the ultrasound frequency range (e.g., sloping upward from approximately 7 dB up to 10 dB between 20 kHz and 100 kHz).

The electronic circuitry 1014 may combine 1106 the first signal 1018 and the second signal 1022. For example, the summer 1024 may combine the first signal 1018 and the second signal 1022 to produce a combined signal 1026 as described above in connection with FIG. 10.

Figure 12:
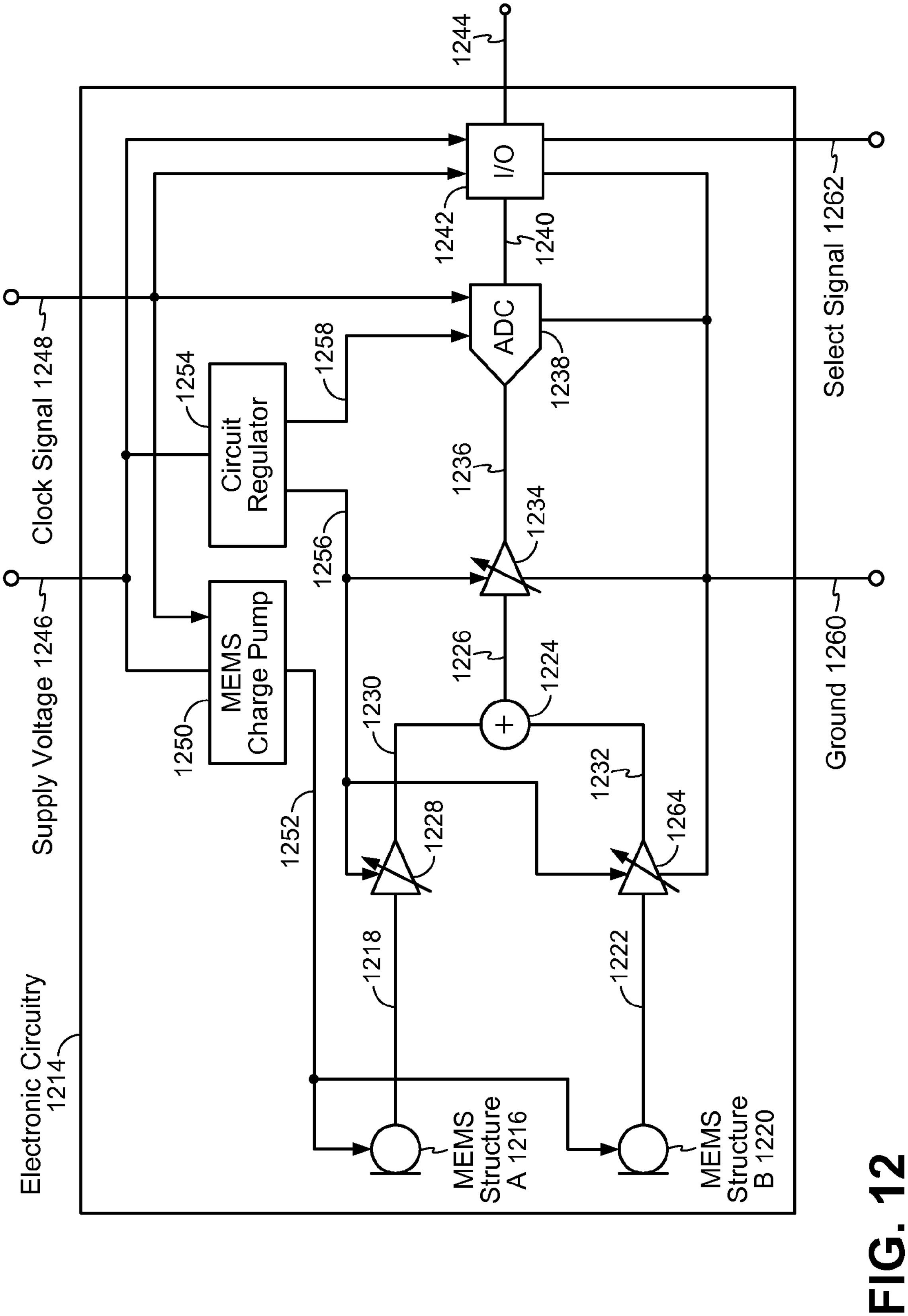
FIG. 12 is a block diagram illustrating one example of electronic circuitry that includes multiple microelectromechanical systems (MEMS) structures in accordance with the systems and methods disclosed herein.

FIG. 12 is a block diagram illustrating one example of electronic circuitry 1214 that includes multiple MEMS structures 1216, 1220 in accordance with the systems and methods disclosed herein. The electronic circuitry 1214 described in connection with FIG. 12 may be one example of the electronic circuitry 1014 described in connection with FIG. 10. One example of the electronic circuitry 1214 is a single microphone that includes two MEMS structures 1216, 1220. The electronic circuitry 1214 may be configured to perform one or more of the methods 1100, 1900 disclosed herein.

The electronic circuitry 1214 includes MEMS structure A 1216 and MEMS structure B 1220, which may be examples of the corresponding MEMS structures 1016, 1020 described in connection with FIG. 10. The electronic circuitry 1214 may optionally include one or more of a MEMS charge pump 1250, a circuit regulator 1254, controllable gain and/or filter block A 1228, controllable gain and/or filter block B 1264, a summer 1224, controllable gain and/or filter block C 1234, an ADC 1238 and an input/output (I/O) block 1242.

The electronic circuitry 1214 may be coupled to a voltage supply and/or to a clock. The voltage supply provides a supply voltage 1246 (e.g., Vdd) to components of the electronic circuitry 1214. For example, the supply voltage 1246 may provide a voltage to the MEMS charge pump 1250, to the circuit regulator 1254 and/or to the I/O block 1242.

The clock provides a clock signal 1248 to components of the electronic circuitry 1214. For example, the clock provides the clock signal 1248 to the MEMS charge pump 1250, to the ADC 1238 and/or to the I/O block 1242.

The MEMS charge pump 1250 is coupled to MEMS structure A 1216 and to MEMS structure B 1220. The MEMS charge pump 1250 may provide a voltage 1252 to MEMS structure A 1216 and to MEMS structure B 1220. For example, the voltage 1252 may charge capacitive diaphragms and/or plates within the MEMS structures 1216, 1220. This may enable electrical signals to be captured as vibrations from acoustic sound signals change the capacitance of the MEMS structures 1216, 1220. Although only a single charge pump voltage 1252 is illustrated in FIG. 12, it should be noted that different voltages may be provided to MEMS structure A 1216 and MEMS structure B 1220 in some configurations. For example, the charge pump voltage 1252 may be a "supply" voltage used to charge the diaphragm of the MEMS structures 1216, 1220. To increase the sensitivity of one or more of the MEMS structures 1216, 1220, higher voltage may be used than a voltage for other components of the electronic circuitry 1214 (e.g., analog and/or digital circuitry). For example, a typical voltage (provided by the regulated power 1256, 1254, for example) for some components of the electronic circuitry 1214 may be between 1.6 volts (V) and 3.3 V, while the charge pump voltage 1252 for the diaphragm(s) may be in the range of 5-10 V. In some configurations, the charge pump 1250 may be implemented with a regulator architecture that boosts the input voltage (e.g., the supply voltage 1246) to a higher output voltage (e.g., charge pump voltage 1252).

MEMS structure A 1216 captures a first signal 1218. MEMS structure A 1216 provides the first signal 1218 to controllable gain and/or filter block A 1228. Controllable gain and/or filter block A 1228 may apply a gain (or attenuation) to the first signal 1218 and/or may filter the first signal 1218 to produce a processed first signal 1230. For example, controllable gain and/or filter block A 1228 may apply amplification/attenuation and/or filtering to the first signal 1218.

MEMS structure B 1220 captures a second signal 1222. MEMS structure B 1220 provides the second signal 1222 to controllable gain and/or filter block B 1264. Controllable gain and/or filter block B 1264 may apply a gain (or attenuation) to the second signal 1222 and/or may filter the second signal 1222 to produce a processed second signal 1232. For example, controllable gain and/or filter block B 1264 (e.g., a preamplifier) may apply amplification/attenuation and/or filtering to the second signal 1222.

The processed first signal 1230 and the processed second signal 1232 may be provided to the summer 1224. The summer 1224 (e.g., mixer) may combine (e.g., sum) the processed first signal 1230 and the processed second signal 1232 to generate a combined signal 1226.

The combined signal 1226 may be provided to controllable gain and/or filter block C 1234. Controllable gain and/or filter block C 1234 may apply a gain (or attenuation) to the combined signal 1226 and/or may filter the combined signal 1226 to produce a processed combined signal 1236. For example, controllable gain and/or filter block C 1234 may apply amplification/attenuation and/or filtering to the combined signal 1226.

It should be noted that one or more of controllable gain and/or filter block A 1228, controllable gain and/or filter block B 1264 and controllable gain and/or filter block C 1234 may be controlled and/or configured through a configuration register or external pins (not shown in FIG. 12) to set the gain(s). For example, register writes and/or pin selection may be utilized to configure and/or control one or more of controllable gain and/or filter block A 1228, controllable gain and/or filter block B 1264 and controllable gain and/or filter block C 1234. In some approaches, this could be a static configuration or software could update the configuration based on other system inputs (e.g., user interface or environment monitoring algorithms, etc.).

The circuit regulator 1254 may provide regulated power 1256, 1258 to one or more elements of the electronic circuitry 1214. For example, the circuit regulator 1254 may be a power supply for controllable gain and/or filter block A 1228, for controllable gain and/or filter block B 1264, for controllable gain and/or filter block C 1234 and/or for the ADC 1238. In some configurations, the circuit regulator 1254 may provide regulated power to additional circuit components.

The processed combined signal 1236 may be provided to the ADC 1238. The ADC may convert the processed combined signal 1236 (an analog signal) to a digital combined signal 1240. For example, the ADC 1238 may represent the processed combined signal 1236 as a series of binary numbers. The digital combined signal 1240 may be provided to the I/O block 1242.

The I/O block 1242 may provide an output signal 1244 based on the digital combined signal 1244. In particular, the I/O block 1242 may provide a version of the digital combined signal 1240 as the output signal 1244 based on the clock signal 1248 and the select signal 1262. For example, the I/O block 1242 may generally provide data output, although the select signal 1262 (via a select pin, for example) is a control input. The I/O block 1242 may receive a select signal 1262. The select signal 1262 may define a phase (e.g., which phase) of the clock signal 1248 at which the output will be driven.

In some configurations, an electronic device may include multiple microphones (e.g., digital microphones), where the electronic circuitry 1214 is one of the microphones. For example, an electronic device may include a pulse density modulation (PDM) interface that allows two microphone data lines to be connected as a one wire bus. In this example, both microphones (where the electronic circuitry 1214 is one of the microphones, for example) cannot drive the bus at the same time. Coordination between the two microphones may be handled with the select signal 1262 (via a select pin, for example). For example, one microphone select signal may be pulled to logic high while the other is pulled to logic low.

In some configurations, the I/O block 1242 may provide an input interface to the electronic circuitry 1214. For example, the I/O block 1242 may provide bi-directional data and control communication. For example, a control signal may be provided to the I/O block 1242, which may set, change, tune and/or adjust gain settings and/or filters (for controllable gain and/or filter block A 1228, controllable gain and/or filter block B 1264 and/or controllable gain and/or filter block C 1234, for instance). In some configurations, the select signal 1262 or another signal may place the I/O block 1242 in an input mode. For example, a signal for placing the I/O block 1242 in input mode, a control signal and/or a data signal may be provided to the I/O block 1242 via a digital bus. Accordingly, the I/O block 1242 may provide a bi-directional digital interface to the electronic circuitry 1214 in some configurations.

As illustrated in FIG. 12, the electronic circuitry 1214 may be coupled to ground 1260. In particular, the electronic circuitry 1214 may include one or more active circuits that require couplings to power and ground to function. For example, one or more of the components of the electronic circuitry 1214 may be coupled to ground 1260. For instance, controllable gain and/or filter block B 1264, controllable gain and/or filter block C 1234, the ADC 1238 and/or the I/O block 1242 may be coupled to ground. Although not shown in FIG. 12, other components may be coupled to ground 1260. For example, controllable gain and/or filter block A 1228 may also be coupled to ground.

FIG. 12 illustrates one example of a digital microphone. In some configurations, the output signal may be a one-bit PDM output. It should be noted that the systems and methods disclosed herein may be applied for an analog MEMS microphone. In analog configurations, for example, the electronic circuitry 1214 may not include the ADC 1238 and I/O block 1242. In an analog configuration, the output signal 1244 may be analog.

Figure 13:
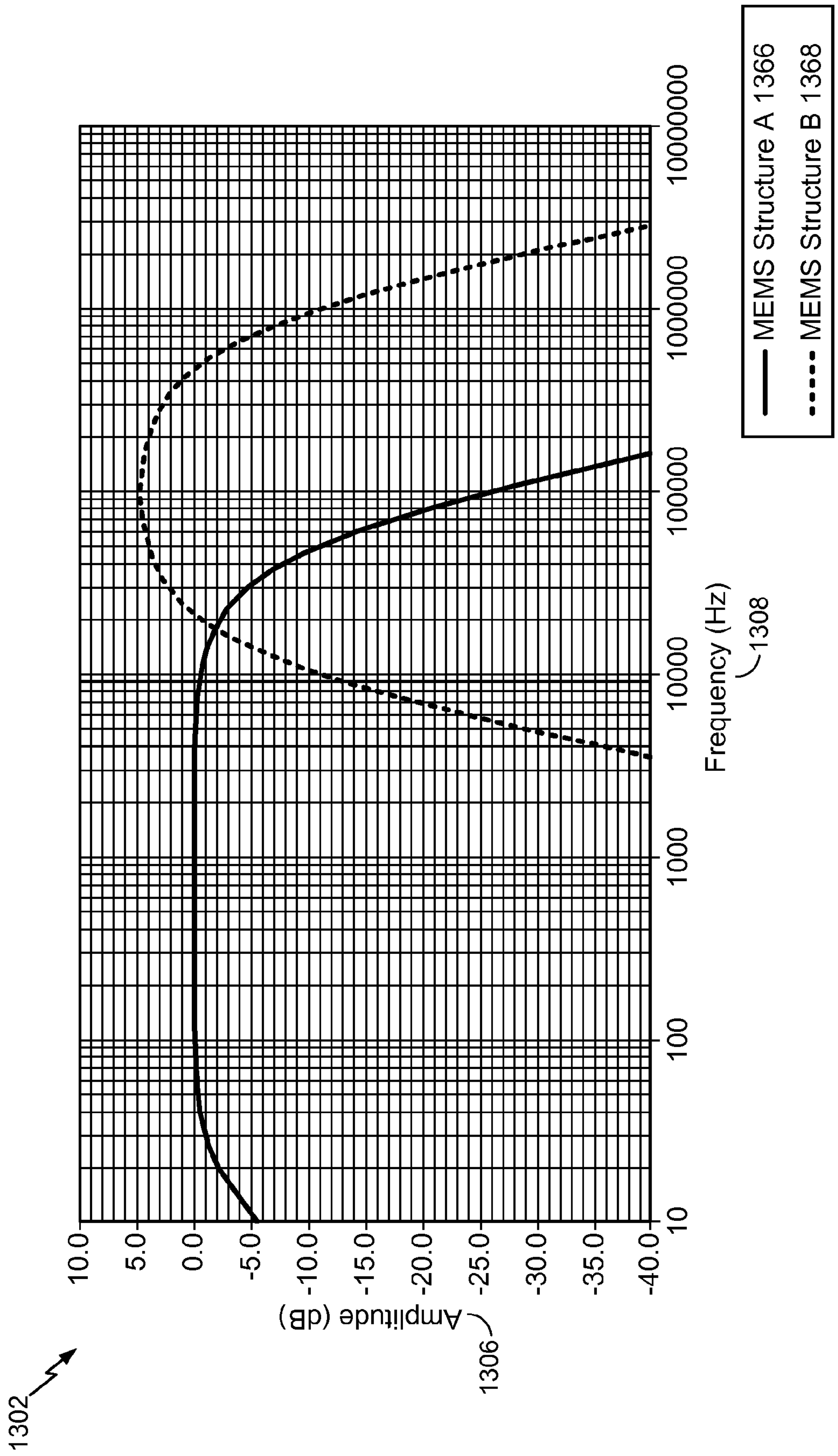
FIG. 13 includes a graph illustrating an example of the frequency response for two MEMS structures in accordance with the systems and methods disclosed herein.

FIG. 13 includes a graph 1302 illustrating an example of the frequency response for two MEMS structures 1366, 1368 (e.g., dual MEMS) in accordance with the systems and methods disclosed herein. The horizontal axis of the graph 1302 is illustrated in frequency (Hz) 1308 and the vertical axis of the graph 1302 is illustrated in amplitude (dB) 1306. FIG. 13 illustrates the frequency response of MEMS structure A 1366 that exhibits a flat response in the voice frequency range (within the audio frequency range) and of MEMS structure B 1368 that exhibits a sloped response in the ultrasound frequency range. For example, the combined frequency response of MEMS structure A 1366 and MEMS structure B 1368 achieves a target frequency response in the voice frequency range (100 Hz$\leq f_{voice} \leq$8 kHz) and in the ultrasound frequency range (20 kHz$\leq f_{ultrasound} \leq$100 kHz). For instance, the combined frequency response of MEMS structure A 1366 varies less than ±2 dB (from 0 dB) in the voice frequency range and varies less than ±4 dB from a sloped target amplitude (that increases from approximately 0 dB at 20 kHz to 5 dB at 100 kHz. In particular, FIG. 13 illustrates one example of a 5 dB boost in the ultrasound frequency range.

Figure 14:
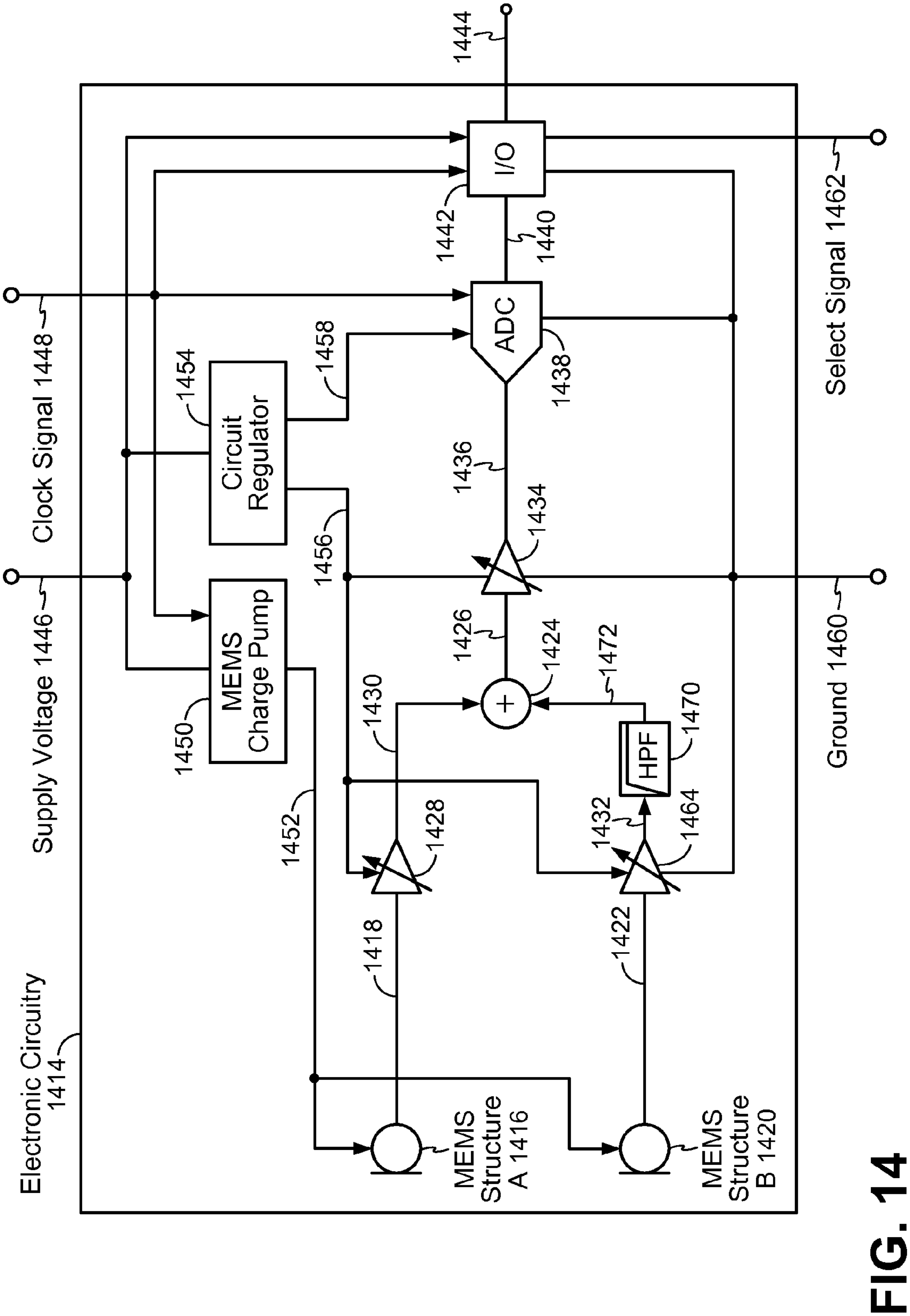
FIG. 14 is a block diagram illustrating another example of electronic circuitry that includes multiple MEMS structures in accordance with the systems and methods disclosed herein.

FIG. 14 is a block diagram illustrating another example of electronic circuitry 1414 that includes multiple MEMS structures 1416, 1420 in accordance with the systems and methods disclosed herein. The electronic circuitry 1414 described in connection with FIG. 14 may be one example of the electronic circuitry 1214 described in connection with FIG. 12. One example of the electronic circuitry 1414 is a single microphone that includes two MEMS structures 1416, 1420. The electronic circuitry 1414 may be configured to perform one or more of the methods 1100, 1900 disclosed herein.

The electronic circuitry 1414 includes MEMS structure A 1416 and MEMS structure B 1420. The electronic circuitry 1414 may optionally include one or more of a MEMS charge pump 1450, a circuit regulator 1454, controllable gain and/or filter block A 1428, controllable gain and/or filter block B 1464, a summer 1424, controllable gain and/or filter block C 1434, an ADC 1438 and an I/O block 1442. The electronic circuitry 1414 may be coupled to a voltage supply and/or to a clock. The voltage supply provides a supply voltage 1446 to components of the electronic circuitry 1414. The clock provides a clock signal 1448 to components of the electronic circuitry 1414. The I/O block 1442 may receive a select signal 1462. The electronic circuitry 1414 may be coupled to ground 1460.

The electronic circuitry 1414 described in connection with FIG. 14 may be configured similarly to the electronic circuitry 1214 described in connection with FIG. 12. In particular, one or more of the components, signals and/or couplings may be configured similarly to the corresponding components, signals and/or couplings described in connection with FIG. 12.

The MEMS charge pump 1450 may provide a voltage 1452 to MEMS structure A 1416 and to MEMS structure B 1420. The circuit regulator 1454 may provide regulated power 1456, 1458 to one or more elements of the electronic circuitry 1414 (e.g., to controllable gain and/or filter block A 1428, to controllable gain and/or filter block B 1464, to controllable gain and/or filter block C 1434 and/or to the ADC 1438). MEMS structure A 1416 captures a first signal 1418. MEMS structure A 1416 provides the first signal 1418 to controllable gain and/or filter block A 1428. MEMS structure B 1420 captures a second signal 1422. MEMS structure B 1420 provides the second signal 1422 to controllable gain and/or filter block B 1464.

Controllable gain and/or filter block A 1428 may apply a gain (or attenuation) to the first signal 1418 and/or may filter the first signal 1418 to produce a processed first signal 1430. Controllable gain and/or filter block B 1464 may apply a gain (or attenuation) to the second signal 1422 and/or may filter the second signal 1422 to produce a processed second signal 1432.

One benefit of utilizing multiple MEMS structures is the ability to mitigate audio frequency range IMD caused by a second signal. Because the MEMS structures 1416, 1420 (e.g., the diaphragms) are different and because the interfacing to the MEMS structures 1416, 1420 are different, for example, IMD can be filtered out before the summer 1424 (e.g., mixer).

In some configurations, a high-pass filter (HPF) 1470 may be coupled to MEMS structure B 1420. For example, controllable gain and/or filter block B 1464 may be coupled to the HPF 1470. The HPF 1470 may filter out energy or one or more signals in the audio frequency range from the second signal 1422 to produce a high-pass filtered second signal 1472.

The HPF 1470 mitigates audio frequency range IMD caused by the second signal 1422. For example, two (or more) tones in the ultrasound frequency range may cause IMD to occur within the audio frequency range. In particular, IMD may occur at sum and/or difference frequencies (and/or at multiples of the sum and difference frequencies) of the tones in the ultrasound frequency range. This may produce noise (e.g., one or more tones) in the audio frequency range. This noise in the audio frequency range may be undesirable, since it may interfere with desired signals in the audio frequency range. For instance, if a user is recording audio or making a phone call while using one or more ultrasound applications (e.g., an ultrasound pen) that utilize multiple tones in the ultrasound frequency range, the IMD may create an audible buzz in the audio frequency range. The HPF 1470 may mitigate the audio frequency range IMD by attenuating energy or one or more signals in the audio frequency range.

The processed first signal 1430 and the high-pass filtered second signal 1472 may be provided to the summer 1424. The summer 1424 may combine (e.g., sum) the processed first signal 1430 and the high-pass filtered second signal 1472 to generate a combined signal 1426.

The combined signal 1426 may be provided to controllable gain and/or filter block C 1434. Controllable gain and/or filter block C 1434 may apply a gain (or attenuation) to the combined signal 1426 and/or may filter the combined signal 1426 to produce a processed combined signal 1436.

The processed combined signal 1436 may be provided to the ADC 1438. The ADC may convert the processed combined signal 1436 (an analog signal) to a digital combined signal 1440. For example, the ADC 1438 may represent the processed combined signal 1436 as a series of binary numbers. The digital combined signal 1440 may be provided to the I/O block 1442. The I/O block 1442 may provide the digital combined signal 1440 as the output signal 1444.

Figure 15:
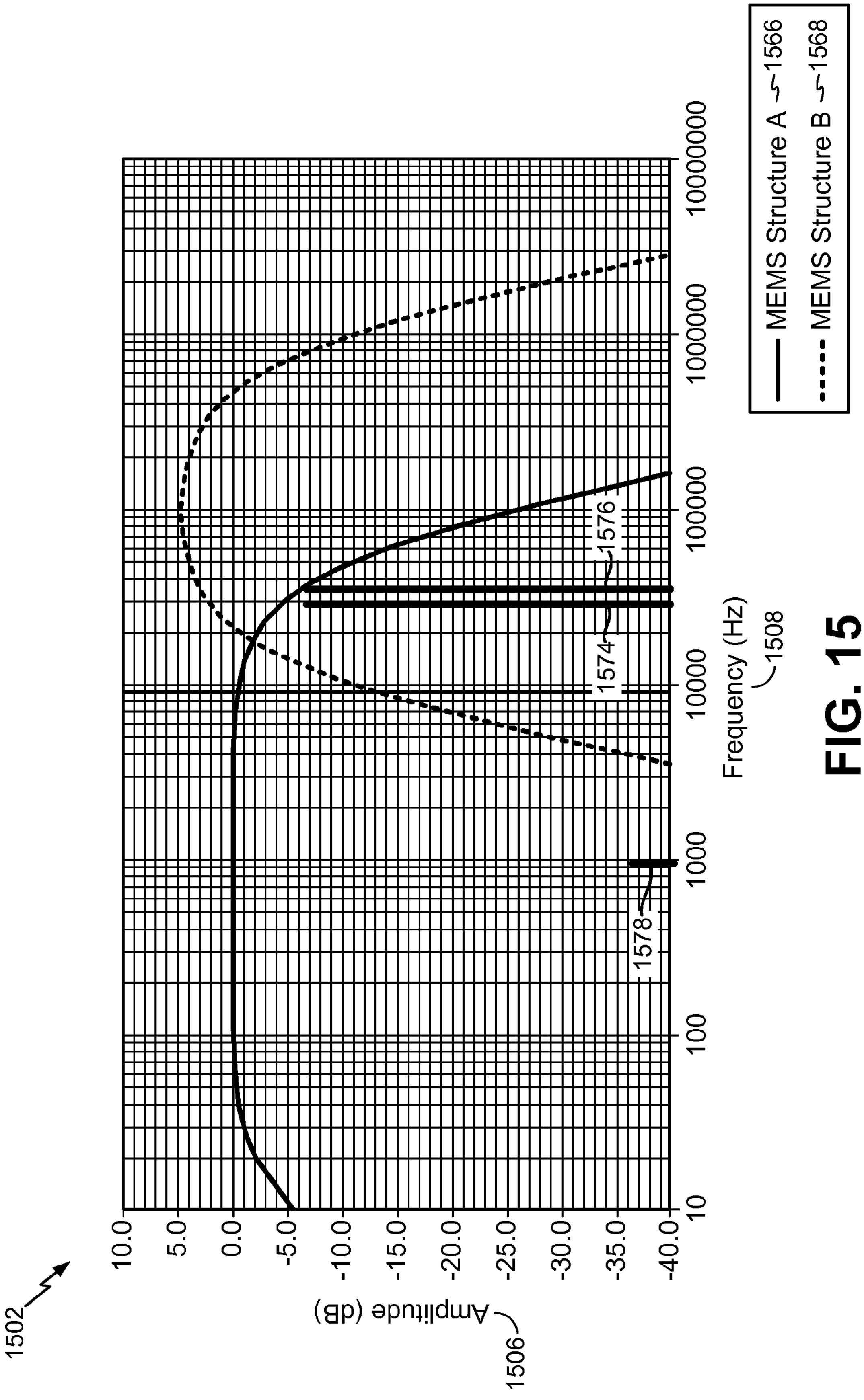
FIG. 15 includes a graph illustrating an example of intermodulation distortion (IMD) that may be mitigated in accordance with the systems and methods disclosed herein.

FIG. 15 includes a graph 1502 illustrating an example of IMD 1578 that may be mitigated in accordance with the systems and methods disclosed herein. The horizontal axis of the graph 1502 is illustrated in frequency (Hz) 1508 and the vertical axis of the graph 1502 is illustrated in amplitude (dB) 1506. FIG. 15 illustrates the frequency response of MEMS structure A 1566 and the frequency response of MEMS structure B 1568 (e.g., dual MEMS) that achieve a target frequency response in the voice frequency range and in the ultrasound frequency range as described in connection with FIG. 13. In this example, two high-frequency tones 1574, 1576 are present that create IMD 1578 in the audio frequency range. More specifically, the two tones 1574, 1576 (one at 30 kHz and another at 31 kHz) will produce a difference tone (e.g., IMD 1578) of 1 kHz in the audio frequency range. It should be noted that higher MEMS sensitivity in the ultrasound frequency range may result in larger IMD in the audio frequency range. As illustrated in FIG. 15, it may be beneficial for a first MEMS structure (e.g., MEMS structure A 1566 to be designed to have a high-frequency roll-off (or a similar IMD problem may occur). For example, a first MEMS structure for the voice and/or audio frequency ranges (e.g., MEMS structure A 1216, 1416 described in connection with FIG. 12 and/or FIG. 14) may have a frequency response that attenuates frequencies above 20 kHz. As described above in connection with FIG. 14, a high-pass filter 1470 may be placed after MEMS structure B 1420 (for the ultrasound frequency range, for example) such that low-frequency IMD may be filtered out.

Figure 16:
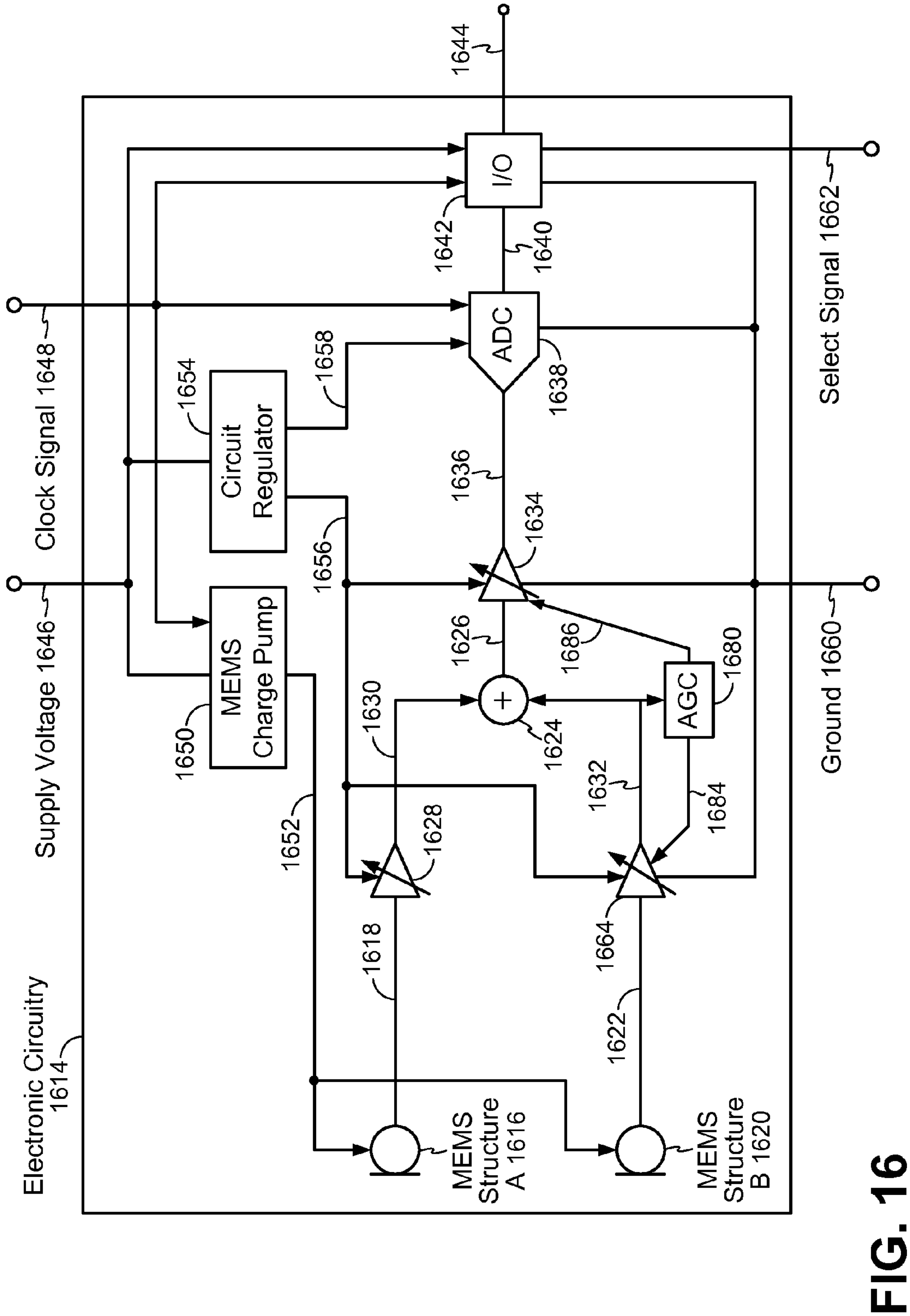
FIG. 16 is a block diagram illustrating another example of electronic circuitry that includes multiple MEMS structures in accordance with the systems and methods disclosed herein.

FIG. 16 is a block diagram illustrating another example of electronic circuitry 1614 that includes multiple MEMS structures 1616, 1620 in accordance with the systems and methods disclosed herein. The electronic circuitry 1614 described in connection with FIG. 16 may be one example of the electronic circuitry 1214 described in connection with FIG. 12. One example of the electronic circuitry 1614 is a single microphone that includes two MEMS structures 1616, 1620. The electronic circuitry 1614 may be configured to perform one or more of the methods 1100, 1900 disclosed herein.

The electronic circuitry 1614 includes MEMS structure A 1616 and MEMS structure B 1620. The electronic circuitry 1614 may optionally include one or more of a MEMS charge pump 1650, a circuit regulator 1654, controllable gain and/or filter block A 1628, controllable gain and/or filter block B 1664, a summer 1624, controllable gain and/or filter block C 1634, an ADC 1638 and an I/O block 1642. The electronic circuitry 1614 may be coupled to a voltage supply and/or to a clock. The voltage supply provides a supply voltage 1646 to components of the electronic circuitry 1614. The clock provides a clock signal 1648 to components of the electronic circuitry 1614. The I/O block 1642 may receive a select signal 1662. The electronic circuitry 1614 may be coupled to ground 1660.

The electronic circuitry 1614 described in connection with FIG. 16 may be configured similarly to the electronic circuitry 1214 described in connection with FIG. 12. In particular, one or more of the components, signals and/or couplings may be configured similarly to the corresponding components, signals and/or couplings described in connection with FIG. 12.

The MEMS charge pump 1650 may provide a voltage 1652 to MEMS structure A 1616 and to MEMS structure B 1620. The circuit regulator 1654 may provide regulated power 1656, 1658 to one or more elements of the electronic circuitry 1614 (e.g., to controllable gain and/or filter block A 1628, to controllable gain and/or filter block B 1664, to controllable gain and/or filter block C 1634 and/or to the ADC 1638). MEMS structure A 1616 captures a first signal 1618. MEMS structure A 1616 provides the first signal 1618 to controllable gain and/or filter block A 1628. MEMS structure B 1620 captures a second signal 1622. MEMS structure B 1620 provides the second signal 1622 to controllable gain and/or filter block B 1664.

Controllable gain and/or filter block A 1628 may apply a gain (or attenuation) to the first signal 1618 and/or may filter the first signal 1618 to produce a processed first signal 1630. Controllable gain and/or filter block B 1664 may apply a gain (or attenuation) to the second signal 1622 and/or may filter the second signal 1622 to produce a processed second signal 1632. Accordingly, the systems and methods disclosed herein provide a microphone with multiple diaphragms with independently adjustable gains or sensitivities in multiple frequency ranges (e.g., in the voice frequency range and in the ultrasound frequency range).

One benefit of utilizing multiple MEMS structures is the ability to apply AGC without additional filtering. For example, AGC based on ultrasound frequency range signals may be applied without first filtering a signal to isolate the ultrasound frequency range signals. In some configurations, AGC circuitry 1680 may be coupled to MEMS structure B 1620. For example, controllable gain and/or filter block B 1664 may be coupled to the AGC circuitry 1680. The AGC circuitry 1680 may utilize the processed second signal 1632 to perform gain and/or filtering control. In some configurations, the AGC circuitry 1680 dynamically makes adjustments (to the gain of controllable gain and/or filter block B 1664 and/or to the gain of controllable gain and/or filter block C 1634, for example) without software intervention based on the incoming signal (e.g., the processed second signal 1632).

In some configurations, the AGC circuitry 1680 may measure the signal level (e.g., amplitude, magnitude, etc.) of the processed second signal 1632 and may provide gain control for controllable gain and/or filter block B 1664 and/or for controllable gain and/or filter block C 1634. For example, the AGC circuitry 1680 may be a meter that adjusts gains based on the processed second signal 1632. The function provided by the AGC circuitry 1680 may be implemented in hardware. For example, the AGC circuitry 1680 may include or may be coupled to tuning registers to set thresholds for gain adjustment. It should be noted that gain adjustment may be done at a zero crossing (when done dynamically, for example) to prevent clicks in the audio signal (e.g., in the processed second signal 1632 and/or in the processed combined signal 1636). It should be noted that automatic gain control may be performed in hardware and/or in software.

Controllable gain and/or filter block B 1664 may provide the processed second signal 1632 to the summer 1624 and to the AGC circuitry 1680. The AGC circuitry 1680 may generate a first AGC signal 1684 and/or a second AGC signal 1686 based on the second signal 1622 (e.g., processed second signal 1632). The first AGC signal 1684 and/or the second AGC signal 1686 may indicate gain(s) (e.g., gain adjustment(s)) to be applied by controllable gain and/or filter block B 1664 and/or controllable gain and/or filter block C 1634, respectively.

The AGC circuitry 1680 may adjust processing in the ultrasound frequency range when a signal level (of the processed second signal 1632) meets or exceeds a threshold. For example, the AGC circuitry 1680 may determine whether the amplitude of the processed second signal 1632 and/or the processed combined signal 1636 may saturate the ADC 1638 (e.g., whether the ADC 1638 would clip the processed combined signal 1636). The AGC circuitry 1680 may utilize one or more thresholds to determine whether the ADC 1638 would become saturated. For example, the AGC circuitry 1680 may include an amplitude threshold. If the amplitude of the processed second signal 1632 meets or exceeds the threshold, the AGC circuitry 1680 may reduce the gain of controllable gain and/or filter block B 1664 and/or the gain of controllable gain and/or filter block C 1634. In some configurations, the one or more thresholds may be predetermined. Additionally or alternatively, the AGC circuitry 1680 may include programmable registers to adjust the one or more thresholds (for tuning or optimizing electronic circuitry 1614 performance, for example). For example, tuning register(s) may be adjustable via a software interface and/or one or more hardware pins to change one or more thresholds of the AGC circuitry 1680.

Utilizing the AGC circuitry 1680 may be beneficial to avoid saturation of the ADC 1638. For example, ultrasound proximity sensors may produce ultrasound signals with sufficiently high amplitude to saturate the ADC 1638. Additionally or alternatively, other ultrasound devices or applications may produce ultrasound signals with sufficiently high amplitude to saturate the ADC 1638.

FIG. 16 illustrates configurations for adjusting the second signal 1622 (e.g., an ultrasound signal) and/or the combined signal 1626. Additionally or alternatively, the combined processed signal 1636 may be provided to the AGC circuitry 1680 (e.g., the output of controllable gain and/or filter block C 1634 may be coupled to the AGC circuitry 1680) and/or provided to separate AGC circuitry (not shown in FIG. 16) to avoid ADC 1638 saturation.

When a signal level (e.g., amplitude of the processed second signal 1632) meets or exceeds a first threshold (e.g., a high threshold) in the ultrasound frequency range, the AGC circuitry 1680 may adjust processing (in the ultrasound frequency range, for example). Adjusting processing may include deactivating MEMS structure B 1620. For example, the AGC circuitry 1680 may turn off controllable gain and/or filter block B 1664 (via the first AGC signal 1684, for instance) and/or may disconnect power from MEMS structure B 1620. Additionally or alternatively, adjusting processing may include adjusting a frequency response of MEMS structure B 1620. For example, the AGC circuitry 1680 may provide a first AGC signal 1684 that causes controllable gain and/or filter block B 1664 to attenuate a frequency range that includes an unwanted signal. Additionally or alternatively, adjusting processing may include reducing a gain of MEMS structure B 1620. For example, the AGC circuitry 1680 may provide a first AGC signal 1684 that causes controllable gain and/or filter block B 1664 to reduce gain.

In one example, a signal level that meets or exceeds the first threshold may be caused by an unwanted signal that is high enough to cause saturation or an unwanted level for the electronic circuitry 1614. In another example, the AGC circuitry 1680 may act on an intended signal. For instance, if an ultrasound pen is very close to the microphone (e.g., electronic circuitry 1614), the signal level may be high (e.g., may meet or exceed the first threshold) and the AGC circuitry 1680 may reduce the gain to bring signal levels within a range.

In some configurations, the AGC circuitry 1680 may additionally or alternatively increase the sensitivity of MEMS structure B 1620. This may aid in the reception of ultrasound signals in the ultrasound frequency range. For example, the AGC circuitry 1680 may adjust controllable gain and/or filter block B 1664 (via the first AGC signal 1684, for instance) in order to amplify a particular frequency range. As described above, the AGC circuitry 1680 may utilize one or more thresholds. For example, the AGC circuitry 1680 may determine whether a signal level (e.g., amplitude, magnitude, etc.) of the processed second signal 1632 is below a second threshold. If the signal level is below the second threshold, the AGC circuitry 1680 may increase the gain of controllable gain and/or filter block B 1664 and/or increase the gain of controllable gain and/or filter block C 1634. This may increase the sensitivity of MEMS structure B 1620. Accordingly, the AGC circuitry 1680 may measure a signal level (of the processed second signal 1632, for example) and adjust gain to improve (e.g., optimize) signal levels.

In some configurations, other AGC circuitry not shown in FIG. 16 (that is separate from the AGC circuitry 1680) may be included in the electronic circuitry 1614. This other AGC circuitry may be in addition to or alternatively from the AGC circuitry 1680 illustrated in FIG. 16. In these configurations, the other AGC circuitry may monitor the processed combined signal 1636 and/or adjust processing. For example, the other AGC circuitry may adjust the gain of controllable gain and/or filter block C 1634 based on a signal level of the processed combined signal 1636. Furthermore, a feedback mechanism to a codec may be optionally provided. This feedback mechanism may provide that once the signal is decimated to a desired sample rate, the gain can be adjusted if needed.

In other configurations, the AGC circuitry 1680 may additionally or alternatively provide a second AGC signal 1686 to controllable gain and/or filter block C 1634. For example, the AGC circuitry 1680 may adjust the filtering and/or gain provided by controllable gain and/or filter block C 1634. For instance, the AGC circuitry 1680 may adjust processing in the ultrasound frequency range by causing the controllable gain and/or filter block C 1634 to attenuate a certain frequency range (e.g., the ultrasound frequency range or a portion thereof) and/or to reduce gain. This may avoid saturating the ADC 1638. In another example, the AGC circuitry 1680 may cause controllable gain and/or filter block C 1634 to amplify the ultrasound frequency range in order to increase sensitivity to signals in the ultrasound frequency range.

The processed first signal 1630 and the processed second signal 1632 may be provided to the summer 1624. The summer 1624 may combine (e.g., sum) the processed first signal 1630 and the processed second signal 1632 to generate a combined signal 1626.

The combined signal 1626 may be provided to controllable gain and/or filter block C 1634. Controllable gain and/or filter block C 1634 may apply a gain (or attenuation) to the combined signal 1626 and/or may filter the combined signal 1626 to produce a processed combined signal 1636. Applying the gain and/or filtering may be based on the second AGC signal 1686 in some configurations.

The processed combined signal 1636 may be provided to the ADC 1638. The ADC 1638 may convert the processed combined signal 1636 (an analog signal) to a digital combined signal 1640. For example, the ADC 1638 may represent the processed combined signal 1636 as a series of binary numbers. The digital combined signal 1640 may be provided to the I/O block 1642. The I/O block 1642 may provide the digital combined signal 1640 as the output signal 1644.

It should be noted that the IMD mitigation described in connection with FIG. 14 and the AGC described in connection with FIG. 16 may be combined in some configurations. For example, for the purposes of removing IMD, a high-pass filter may be implemented anywhere in the path between MEMS structure B 1620 and the summer 1624. However, it may be beneficial to place the high-pass filter close to MEMS structure B 1620. In some configurations, controllable gain and/or filter block B 1664 may be designed for the ultrasound frequency range only, where the coupling between MEMS structure B 1620 and the controllable gain and/or filter block B is alternating current (AC) coupled with a high-pass filter corner of 20 kHz. Additionally or alternatively, this may be designed as a buffer amplifier, which is followed by an active filter, which is followed by an adjustable gain amplifier controlled by AGC. It should be noted that with three amplifiers, power consumption may be increased, resulting in a design challenge to combine these three stages into one.

Figure 17:
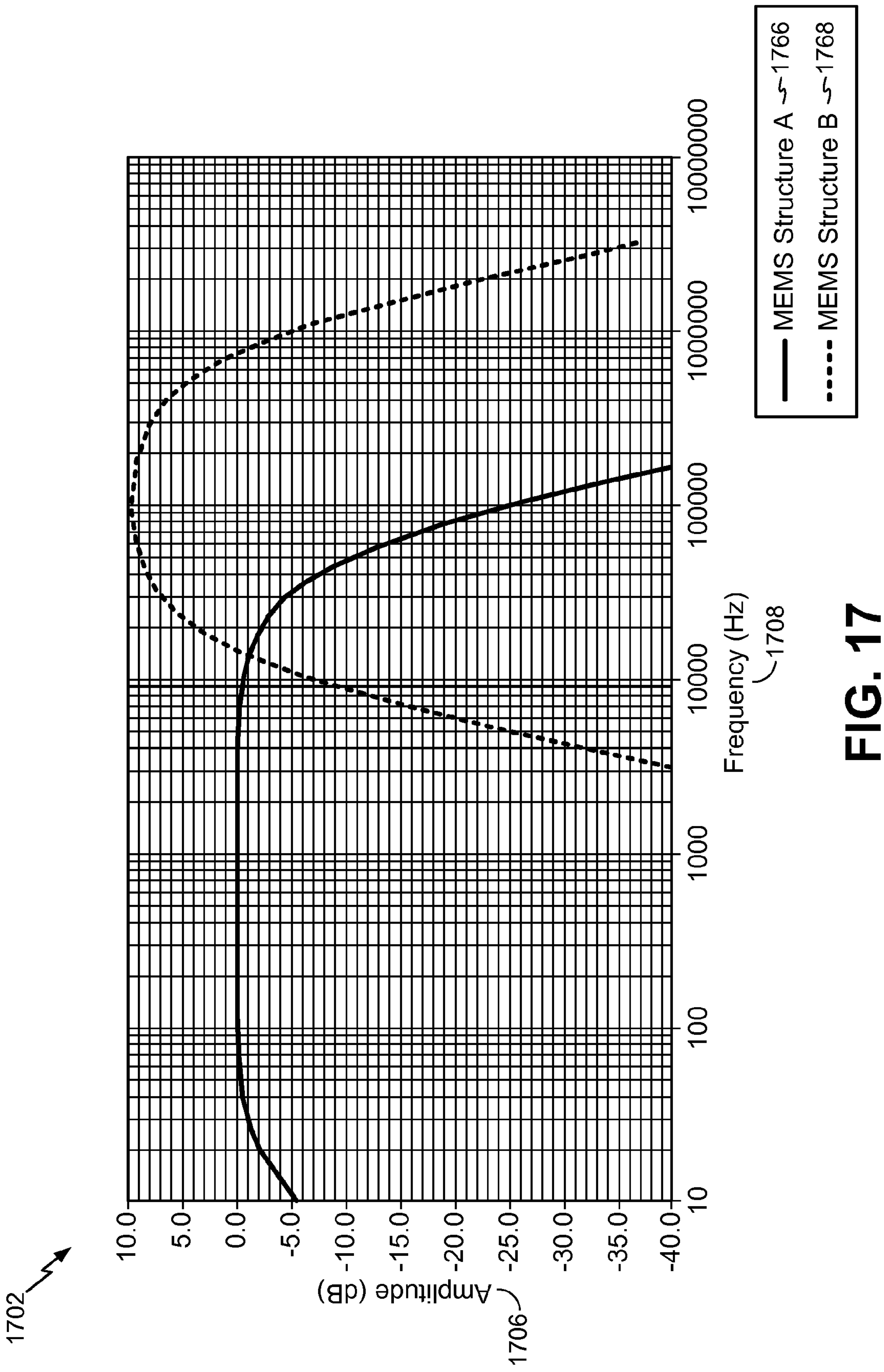
FIG. 17 includes a graph illustrating another example of the frequency response for two MEMS structures in accordance with the systems and methods disclosed herein.

FIG. 17 includes a graph 1702 illustrating another example of the frequency response for two MEMS structures 1766, 1768 (e.g., dual MEMS) in accordance with the systems and methods disclosed herein. The horizontal axis of the graph 1702 is illustrated in frequency (Hz) 1708 and the vertical axis of the graph 1702 is illustrated in amplitude (dB) 1706. FIG. 17 illustrates the frequency response of MEMS structure A 1766 that exhibits a flat response in the voice frequency range (within the audio frequency range) and of MEMS structure B 1768 that exhibits a sloped response in the ultrasound frequency range. For example, the combined frequency response of MEMS structure A 1766 and MEMS structure B 1768 achieves a target frequency response in the voice frequency range (100 Hz≤$f_{voice}$≤8 kHz) and in the ultrasound frequency range (20 kHz≤$f_{ultrasound}$≤100 kHz). For instance, the combined frequency response of MEMS structure A 1766 varies less than ±2 dB (from 0 dB) in the voice frequency range and varies less than ±4 dB from a sloped target amplitude (that increases from approximately 0 dB at 15 kHz to 10 dB at 100 kHz. In particular, FIG. 17 illustrates one example of a 10 dB boost in the ultrasound frequency range. More specifically, the combined frequency response (of MEMS structure A 1766 combined with MEMS structure B 1768) may have a slope in the ultrasound frequency range between 20 kHz and 100 kHz. In this example, MEMS structure B 1768 exhibits increased ultrasound sensitivity through AGC. As described in connection with FIG. 16, AGC may be performed by increasing the gain of a controllable gain block. This may increase the sensitivity of MEMS structure B 1768 as illustrated in FIG. 17.

Figure 18:
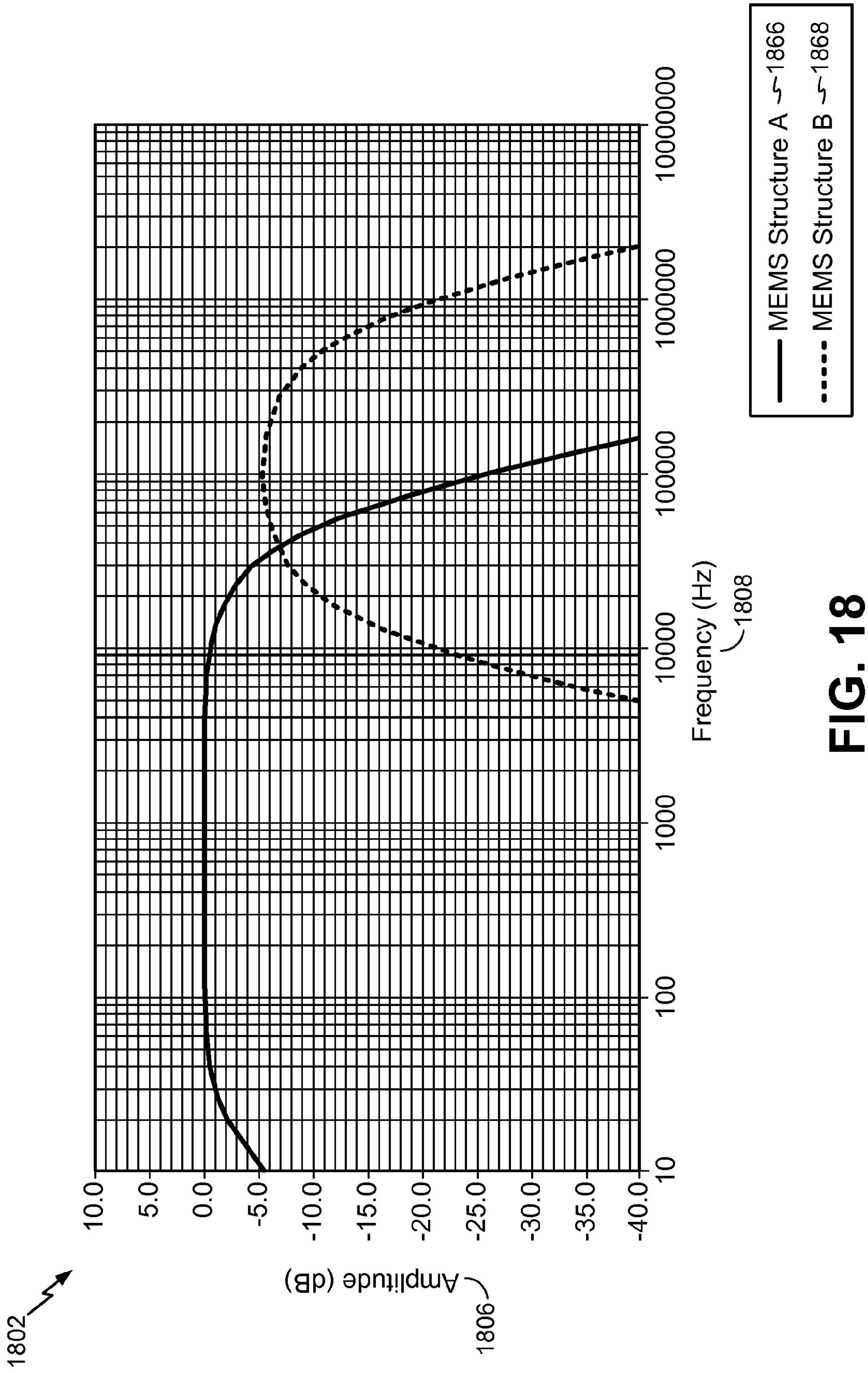
FIG. 18 includes a graph illustrating another example of the frequency response for two MEMS structures in accordance with the systems and methods disclosed herein.

FIG. 18 includes a graph 1802 illustrating another example of the frequency response for two MEMS structures 1866, 1868 (e.g., dual MEMS) in accordance with the systems and methods disclosed herein. The horizontal axis of the graph 1802 is illustrated in frequency (Hz) 1808 and the vertical axis of the graph 1802 is illustrated in amplitude (dB) 1806. FIG. 18 illustrates a combined frequency response of MEMS structure A 1866 and MEMS structure B 1868 that includes a flat response in the voice frequency range (within the audio frequency range) and a sloped response in the ultrasound frequency range. For example, the combined frequency response of MEMS structure A 1866 and MEMS structure B 1868 achieves a target frequency response in the voice frequency range (100 Hz≤$f_{voice}$≤8 kHz) and in the ultrasound frequency range (20 kHz≤$f_{ultrasound}$≤100 kHz). For instance, the combined frequency response of MEMS structure A 1866 varies less than ±2 dB (from 0 dB) in the voice frequency range and varies less than ±4 dB from a sloped target amplitude (that decreases from approximately 0 dB at 10 kHz to −5 dB at 100 kHz. In particular, FIG. 18 illustrates one example of a 5 dB attenuation in the ultrasound frequency range. For audio or voice only scenarios, for example, it may be beneficial to attenuate ultrasound frequency range sensitivity.

In this example, MEMS structure B 1868 exhibits decreased ultrasound sensitivity through AGC. As described in connection with FIG. 16, AGC may be performed by decreasing the gain of a controllable gain block. This may decrease the sensitivity of MEMS structure B 1868 as illustrated in FIG. 18. As can be observed in connection with FIGS. 16-18, the systems and methods disclosed herein provide a microphone with multiple diaphragms that enable independently adjustable gains or sensitivities in multiple frequency ranges (e.g., in the voice frequency range and in the ultrasound frequency range).

Figure 19:
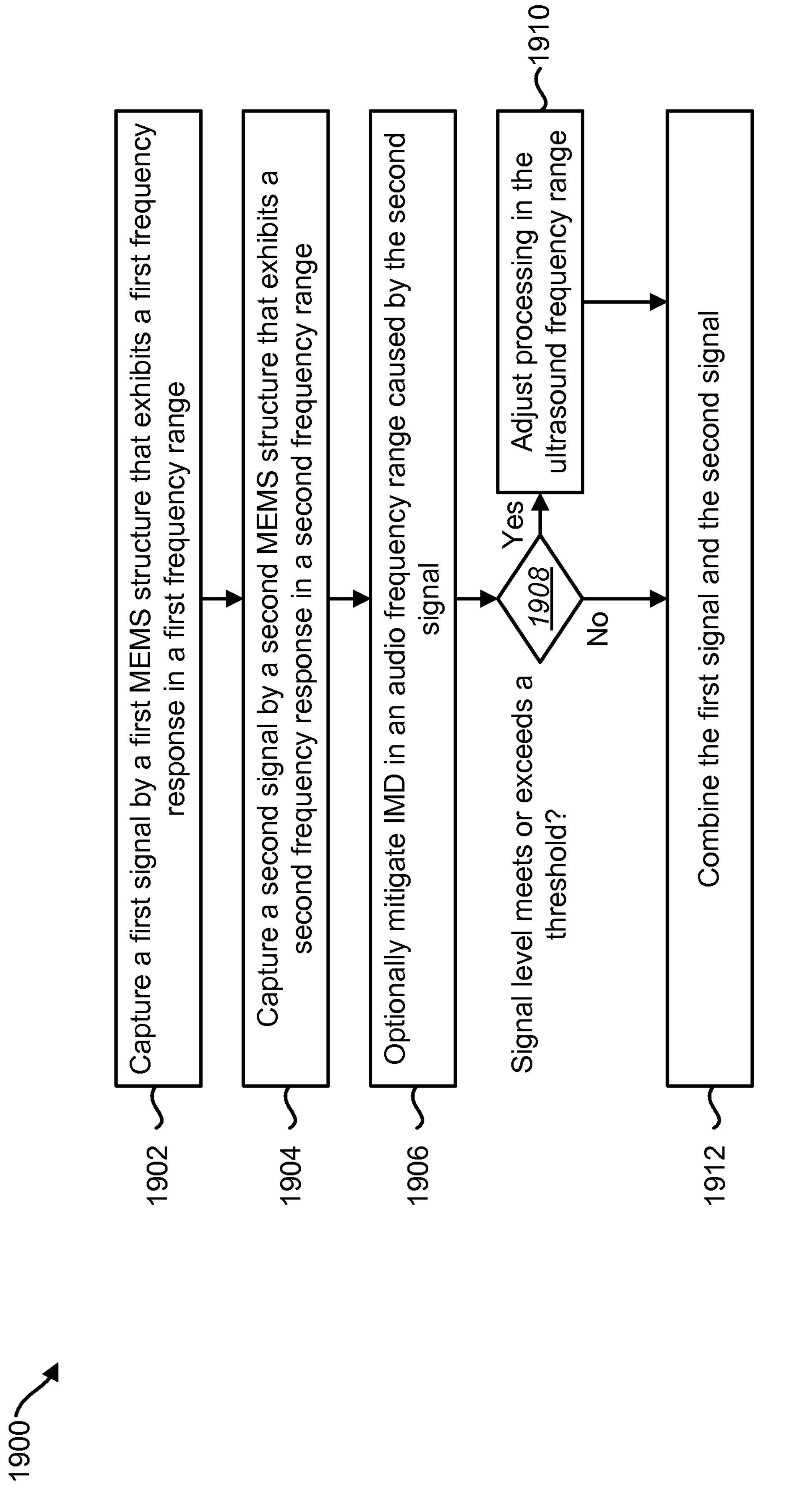
FIG. 19 is a flow diagram illustrating a more specific configuration of a method for providing a wide band frequency response by one or more of the electronic circuitries described herein.

FIG. 19 is a flow diagram illustrating a more specific configuration of a method 1900 for providing a wide band frequency response by one or more of the electronic circuitries described herein (e.g., electronic circuitry 1014, 1214, 1414, 1614, 2014). The electronic circuitry 1014 may capture 1902 a first signal 1018 by MEMS structure A 1016 that exhibits a first frequency response in a first (e.g., voice) frequency range. For example, MEMS structure A 1016 may convert an acoustic first signal to an electrical first signal 1018 as described above in connection with FIG. 10.

The electronic circuitry 1014 may capture 1904 a second signal 1022 by MEMS structure B 1020 that exhibits a second frequency response in a second (e.g., ultrasound) frequency range. For example, MEMS structure B 1020 may convert an acoustic second signal to an electrical second signal 1022 as described above in connection with FIG. 10.

The electronic circuitry 1014 may optionally mitigate 1906 IMD in an audio frequency range caused by the second signal. For example, the electronic circuitry 1014 may high-pass filter the second signal 1022 (e.g., a processed second signal) in order to attenuate IMD that may occur in the audio frequency range that is caused by multiple tones in the ultrasound frequency range. For instance, the electronic circuitry 1014 may mitigate 1906 IMD as described above in connection with FIG. 14. It should be noted that in some configurations, the first MEMS structure (e.g., MEMS structure A 1016) may have a high-frequency roll-off that avoids IMD in the ultrasound frequency range that are caused by signals in the audio frequency range and/or in the ultrasound frequency range.

The electronic circuitry 1014 may optionally determine 1908 whether a signal level meets or exceeds a threshold in the ultrasound frequency range. This may be accomplished as described above in connection with FIG. 16. For example, the electronic circuitry 1014 may determine 1908 whether there are signal(s) and/or energy in the ultrasound frequency range with amplitude that meets or exceeds a first threshold (e.g., a high threshold). For instance, the electronic circuitry 1014 may determine 1908 whether an amplitude of the second signal (e.g., processed second signal) would saturate an ADC. In some configurations, if the signal level is below a second threshold (e.g., a low threshold) in the ultrasound frequency range, the electronic circuitry 1014 may optionally increase the sensitivity of MEMS structure B 1020 as described above in connection with FIG. 16.

If the signal level does not meet or exceed the threshold (e.g., the first or "high" threshold) in the ultrasound frequency range, the electronic circuitry 1014 may combine 1912 the first signal 1018 and the second signal 1022. This may be accomplished as described above in connection with one or more of FIG. 10, FIG. 12, FIG. 14 and FIG. 16.

If the signal level meets or exceeds the threshold (e.g., the first or "high" threshold) in the ultrasound frequency range, the electronic circuitry 1014 may optionally adjust 1910 processing in the ultrasound frequency range. This may be accomplished as described above in connection with FIG. 16. For example, the electronic circuitry 1014 may deactivate MEMS structure B 1020, adjust a frequency response of MEMS structure B 1020 and/or reduce a gain of MEMS structure B 1020. This may be accomplished by controlling one or more controllable gain and/or filter blocks as described above.

The electronic circuitry 1014 may combine 1912 the first signal 1018 and the second signal 1022. For example, the summer 1024 may combine the first signal 1018 and the second signal 1022 to produce a combined signal 1026 as described above in connection with one or more of FIG. 10, FIG. 12, FIG. 14 and FIG. 16.

In some configurations, the method 1900 may include one or more additional steps. For example, the method 1900 may include one or more of the functions described in connection with one or more of FIG. 12, FIG. 14 and FIG. 16. For instance, the electronic circuitry may provide voltage(s) to MEMS structures, may filter, amplify and/or attenuate one or more signals and/or may convert an analog signal to a digital signal.

Figure 20:
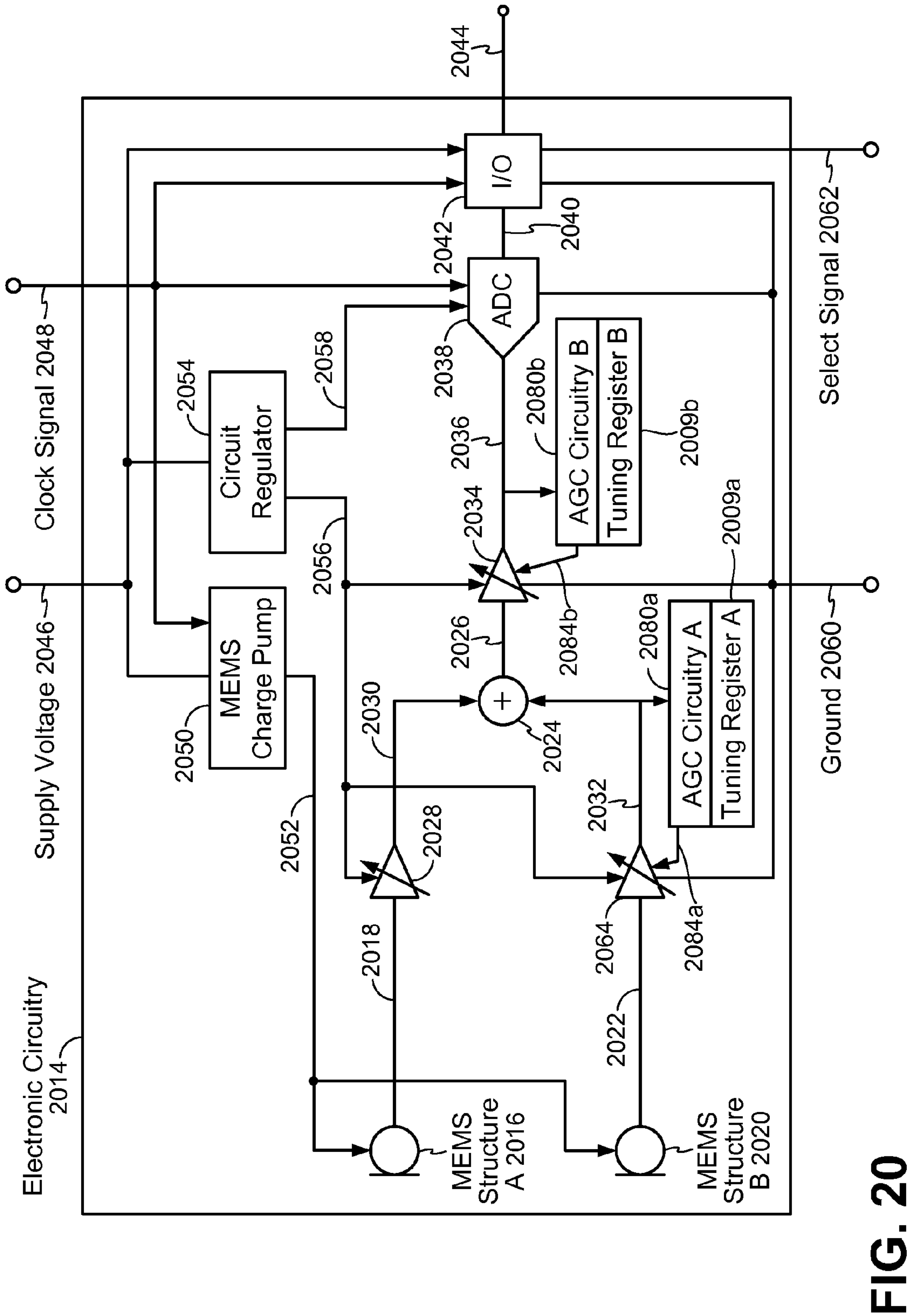
FIG. 20 is a block diagram illustrating another example of electronic circuitry that includes multiple MEMS structures in accordance with the systems and methods disclosed herein.

FIG. 20 is a block diagram illustrating another example of electronic circuitry 2014 that includes multiple MEMS structures 2016, 2020 in accordance with the systems and methods disclosed herein. The electronic circuitry 2014 described in connection with FIG. 20 may be one example of the electronic circuitry 1214 described in connection with FIG. 12. One example of the electronic circuitry 2014 is a single microphone that includes two MEMS structures 2016, 2020. The electronic circuitry 2014 may be configured to perform one or more of the methods 1100, 1900 disclosed herein.

The electronic circuitry 2014 includes MEMS structure A 2016 and MEMS structure B 2020. The electronic circuitry 2014 may optionally include one or more of a MEMS charge pump 2050, a circuit regulator 2054, controllable gain and/or filter block A 2028, controllable gain and/or filter block B 2064, a summer 2024, controllable gain and/or filter block C 2034, an ADC 2038 and an I/O block 2042. The electronic circuitry 2014 may be coupled to a voltage supply and/or to a clock. The voltage supply provides a supply voltage 2046 to components of the electronic circuitry 2014. The clock provides a clock signal 2048 to components of the electronic circuitry 2014. The I/O block 2042 may receive a select signal 2062. The electronic circuitry 2014 may be coupled to ground 2060.

The electronic circuitry 2014 described in connection with FIG. 20 may be configured similarly to the electronic circuitry 1214 described in connection with FIG. 12. In particular, one or more of the components, signals and/or couplings may be configured similarly to the corresponding components, signals and/or couplings described in connection with FIG. 12.

The MEMS charge pump 2050 may provide a voltage 2052 to MEMS structure A 2016 and to MEMS structure B 2020. The circuit regulator 2054 may provide regulated power 2056, 2058 to one or more elements of the electronic circuitry 2014 (e.g., to controllable gain and/or filter block A 2028, to controllable gain and/or filter block B 2064, to controllable gain and/or filter block C 2034 and/or to the ADC 2038). MEMS structure A 2016 captures a first signal 2018. MEMS structure A 2016 provides the first signal 2018 to controllable gain and/or filter block A 2028. MEMS structure B 2020 captures a second signal 2022. MEMS structure B 2020 provides the second signal 2022 to controllable gain and/or filter block B 2064.

Controllable gain and/or filter block A 2028 may apply a gain (or attenuation) to the first signal 2018 and/or may filter the first signal 2018 to produce a processed first signal 2030. Controllable gain and/or filter block B 2064 may apply a gain (or attenuation) to the second signal 2022 and/or may filter the second signal 2022 to produce a processed second signal 2032.

In the example illustrated in FIG. 20, AGC circuitry A 2080*a* may be coupled to MEMS structure B 2020. For example, controllable gain and/or filter block B 2064 may be coupled to AGC circuitry A 2080*a*. AGC circuitry A 2080*a* may utilize the processed second signal 2032 to perform gain and/or filtering control. In some configurations, AGC circuitry A 2080*a* dynamically makes adjustments (to the gain of controllable gain and/or filter block B 2064, for example) without software intervention based on the incoming signal (e.g., the processed second signal 2032).

In some configurations, AGC circuitry A 2080*a* may measure the signal level (e.g., amplitude, magnitude, etc.) of the processed second signal 2032 and may provide gain control for controllable gain and/or filter block B 2064. For example, AGC circuitry A 2080*a* may be a meter that adjusts gains based on the processed second signal 2032. The function provided by AGC circuitry A 2080*a* may be implemented in hardware. For example, AGC circuitry A 2080*a* may include or may be coupled to tuning register A 2009*a* to set thresholds for gain adjustment. It should be noted that gain adjustment may be done at a zero crossing (when done dynamically, for example) to prevent clicks in the audio signal (e.g., in the processed second signal 2032 and/or in the processed combined signal 2036). It should be noted that automatic gain control may be performed in hardware and/or in software.

Controllable gain and/or filter block B 2064 may provide the processed second signal 2032 to the summer 2024 and to AGC circuitry A 2080*a*. AGC circuitry A 2080*a* may generate AGC signal A 2084*a* based on the second signal 2022 (e.g., processed second signal 2032). The AGC signal A 2084*a* may indicate gain(s) (e.g., gain adjustment(s)) to be applied by controllable gain and/or filter block B 2064.

AGC circuitry A 2080*a* may adjust processing in the ultrasound frequency range when a signal level (of the processed second signal 2032) meets or exceeds a threshold. For example, AGC circuitry A 2080*a* may determine whether the amplitude of the processed second signal 2032 may saturate the ADC 2038 (e.g., whether the ADC 2038 would clip the processed combined signal 2036). AGC circuitry A 2080*a* may utilize one or more thresholds to determine whether the ADC 2038 would become saturated. For example, AGC circuitry A 2080*a* may include an amplitude threshold. If the amplitude of the processed second signal 2032 meets or exceeds the threshold, AGC circuitry A 2080*a* may reduce the gain of controllable gain and/or filter block B 2064. As illustrated in FIG. 20, AGC circuitry A 2080*a* may include or be coupled to tuning register A 2009*a* to adjust the one or more thresholds (for tuning or optimizing electronic circuitry 2014 performance, for example). For example, tuning register A 2009*a* may be adjustable via a software interface and/or one or more hardware pins to change one or more thresholds of AGC circuitry A 2080*a*.

When a signal level (e.g., amplitude of the processed second signal 2032) meets or exceeds a first threshold (e.g., a high threshold) in the ultrasound frequency range, AGC circuitry A 2080*a* may adjust processing (in the ultrasound frequency range, for example). Adjusting processing may include deactivating MEMS structure B 2020. For example, AGC circuitry A 2080*a* may turn off controllable gain and/or filter block B 2064 (via AGC signal A 2084*a*, for instance) and/or may disconnect power from MEMS structure B 2020. Additionally or alternatively, adjusting processing may include adjusting a frequency response of MEMS structure B 2020. For example, AGC circuitry A 2080*a* may provide AGC signal A 2084*a* that causes controllable gain and/or filter block B 2064 to attenuate a frequency range that includes an unwanted signal. Additionally or alternatively, adjusting processing may include reducing a gain of MEMS structure B 2020. For example, AGC circuitry A 2080*a* may provide AGC signal A 2084*a* that causes controllable gain and/or filter block B 2064 to reduce gain.

In one example, a signal level that meets or exceeds the first threshold may be caused by an unwanted signal that is high enough to cause saturation or an unwanted level for the electronic circuitry 2014. In another example, AGC circuitry A 2080*a* may act on an intended signal. For instance, if an ultrasound pen is very close to the microphone (e.g., electronic circuitry 2014), the signal level may be high (e.g., may meet or exceed the first threshold) and AGC circuitry A 2080*a* may reduce the gain to bring signal levels within a range.

In some configurations, AGC circuitry A 2080*a* may additionally or alternatively increase the sensitivity of MEMS structure B 2020. This may aid in the reception of ultrasound signals in the ultrasound frequency range. For example, AGC circuitry A 2080*a* may adjust controllable gain and/or filter block B 2064 (via AGC signal A 2084*a*, for instance) in order to amplify a particular frequency range. As described above, AGC circuitry A 2080*a* may utilize one or more thresholds. For example, AGC circuitry A 2080*a* may determine whether a signal level (e.g., amplitude, magnitude, etc.) of the processed second signal 2032 is below a second threshold. If the signal level is below the second threshold, AGC circuitry A 2080*a* may increase the gain of controllable gain and/or filter block B 2064. This may increase the sensitivity of MEMS structure B 2020. Accordingly, AGC circuitry A 2080*a* may measure a signal level (of the processed second signal 2032, for example) and adjust gain to improve (e.g., optimize) signal levels.

The processed first signal 2030 and the processed second signal 2032 may be provided to the summer 2024. The summer 2024 may combine (e.g., sum) the processed first signal 2030 and the processed second signal 2032 to generate a combined signal 2026.

The combined signal 2026 may be provided to controllable gain and/or filter block C 2034 and to AGC circuitry B 2080*b*. Controllable gain and/or filter block C 2034 may apply a gain (or attenuation) to the combined signal 2026 and/or may filter the combined signal 2026 to produce a processed combined signal 2036. Applying the gain and/or filtering may be based on AGC signal B 2084*b* in some configurations.

In the example illustrated in FIG. 20, AGC circuitry B 2080*b* may monitor the processed combined signal 2036 and/or adjust processing. For example, AGC circuitry B 2080*b* may adjust the gain of controllable gain and/or filter block C 2034 based on a signal level of the processed combined signal 2036.

AGC circuitry B 2080*b* may adjust processing in one or more frequency ranges when a signal level (of the processed combined signal 2036) meets or exceeds a threshold. For example, AGC circuitry B 2080*b* may determine whether the amplitude of the processed combined signal 2036 may saturate the ADC 2038 (e.g., whether the ADC 2038 would clip the processed combined signal 2036). The AGC circuitry B 2080B may utilize one or more thresholds to determine whether the ADC 2038 would become saturated. For example, AGC circuitry B 2080*b* may include an amplitude threshold. If the amplitude of the processed combined signal 2036 meets or exceeds the threshold, AGC circuitry B 2080*b* may reduce the gain of controllable gain and/or filter block C 2034. As illustrated in FIG. 20, AGC circuitry B 2080*b* may include or be coupled to tuning register B 2009*b* to adjust the one or more thresholds (for tuning or optimizing electronic circuitry 2014 performance, for example). For example, tuning register B 2009*b* may be adjustable via a software interface and/or one or more hardware pins to change one or more thresholds of AGC circuitry B 2080*b*.

When a signal level (e.g., amplitude of the processed combined signal 2036) meets or exceeds a third threshold (e.g., a high threshold) in one or more frequency ranges, AGC circuitry B 2080*b* may adjust processing (in one or more frequency ranges, for example). Adjusting processing may include adjusting a frequency response of the combined MEMS structures 2016, 2020. For example, AGC circuitry B 2080*b* may provide AGC signal B 2084*b* that causes controllable gain and/or filter block C 2034 to attenuate a frequency range that includes an unwanted signal. Additionally or alternatively, adjusting processing may include reducing a gain of the combined MEMS structures 2016, 2020. For example, AGC circuitry B 2080*b* may provide AGC signal B 2084*b* that causes controllable gain and/or filter block C 2034 to reduce gain.

In one example, a signal level that meets or exceeds the third threshold may be caused by an unwanted signal that is high enough to cause saturation or an unwanted level for the electronic circuitry 2014. In another example, AGC circuitry B 2080*b* may act on an intended signal. For instance, a user's voice and/or a desired ultrasound control signal have a signal level that would saturate the ADC 2038, the signal level may be high (e.g., may meet or exceed the first threshold) and AGC circuitry B 2080*b* may reduce the gain to bring signal levels within a range.

In some configurations, AGC circuitry B 2080*b* may additionally or alternatively increase the sensitivity of the combined MEMS structures 2016, 2020. This may aid in the reception of signals in one or more frequency ranges. For example, AGC circuitry B 2080*b* may adjust controllable gain and/or filter block C 2034 (via AGC signal B 2084*b*, for instance) in order to amplify a particular frequency range. As described above, AGC circuitry B 2080*b* may utilize one or more thresholds. For example, AGC circuitry B 2080*b* may determine whether a signal level (e.g., amplitude, magnitude, etc.) of the combined processed signal 2032 is below a fourth threshold. If the signal level is below the fourth threshold, AGC circuitry B 2080*b* may increase the gain of controllable gain and/or filter block C 2034. This may increase the sensitivity of the combined MEMS structures 2016, 2020. Accordingly, AGC circuitry B 2080*b* may measure a signal level (of the processed combined signal 2036, for example) and adjust gain to improve (e.g., optimize) signal levels.

In some configurations, a feedback mechanism to a codec may be optionally provided. This feedback mechanism may provide that once the signal is decimated to a desired sample rate, the gain can be adjusted if needed.

The processed combined signal 2036 may be provided to the ADC 2038. The ADC 2038 may convert the processed combined signal 2036 (an analog signal) to a digital combined signal 2040. For example, the ADC 2038 may represent the processed combined signal 2036 as a series of binary numbers. The digital combined signal 2040 may be provided to the I/O block 2042. The I/O block 2042 may provide the digital combined signal 2040 as the output signal 2044.

It should be noted that the IMD mitigation described in connection with FIG. 14 and the AGC described in connection with FIG. 20 may be combined in some configurations. For example, for the purposes of removing IMD, a high-pass filter may be implemented anywhere in the path between MEMS structure B 2020 and the summer 2024. However, it may be beneficial to place the high-pass filter close to MEMS structure B 2020. In some configurations, controllable gain and/or filter block B 2064 may be designed for the ultrasound frequency range only, where the coupling between MEMS structure B 2020 and the controllable gain and/or filter block B is alternating current (AC) coupled with a high-pass filter corner of 20 kHz. Additionally or alternatively, this may be designed as a buffer amplifier, which is followed by an active filter, which is followed by an adjustable gain amplifier controlled by AGC. It should be noted that with three amplifiers, power consumption may be increased, resulting in a design challenge to combine these three stages into one.

Figure 21:
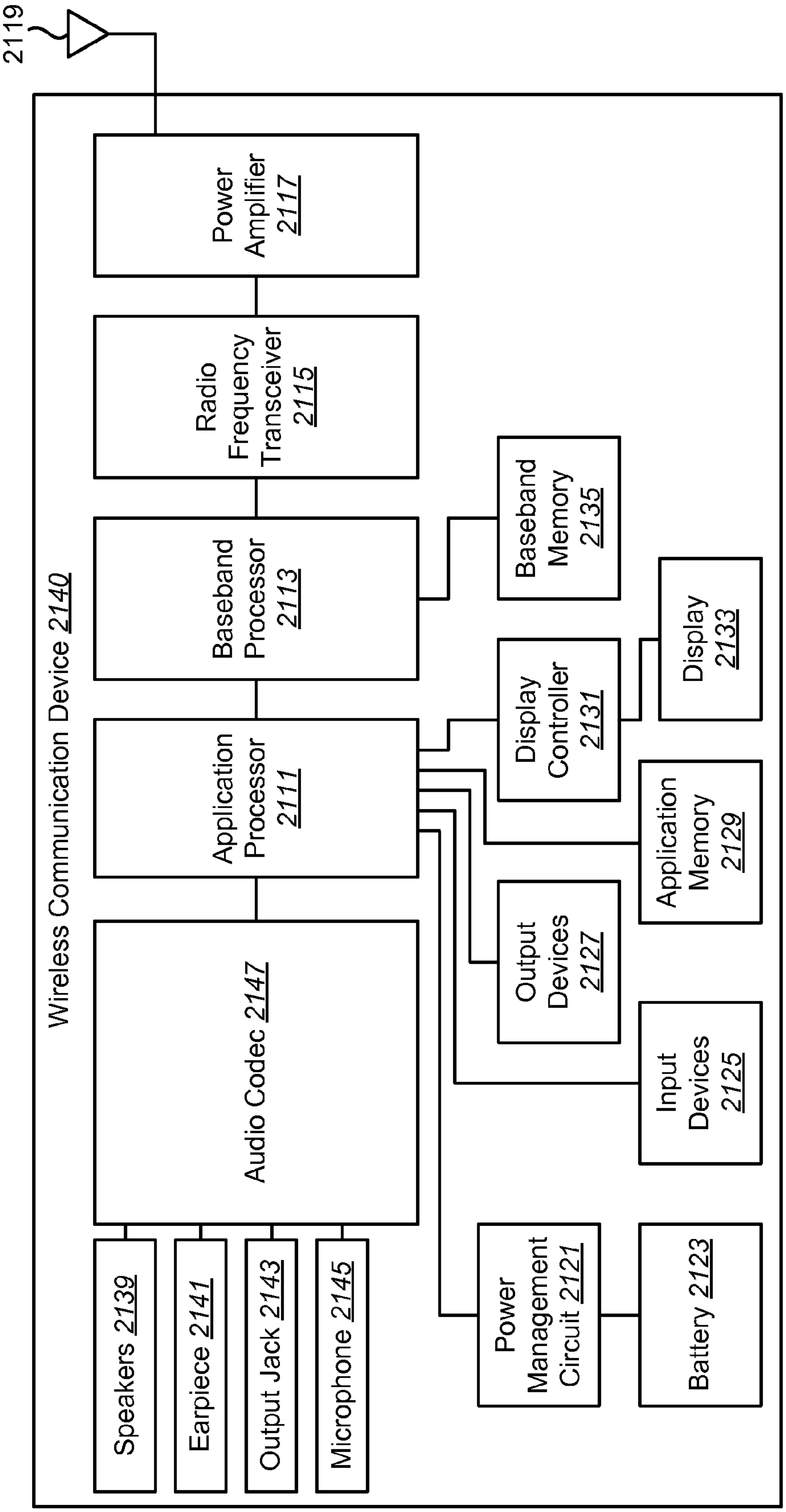
FIG. 21 is a block diagram illustrating one configuration of a wireless communication device in which systems and methods for providing a wideband frequency response may be implemented.

FIG. 21 is a block diagram illustrating one configuration of a wireless communication device 2137 in which systems and methods for providing a wideband frequency response may be implemented. The wireless communication device 2137 illustrated in FIG. 21 may be implemented to include one or more of the electronic circuitries 1014, 1214, 1414, 1614, 2014 described herein. The wireless communication device 2137 may include an application processor 2111. The application processor 2111 generally processes instructions (e.g., runs programs) to perform functions on the wireless communication device 2137. The application processor 2111 may be coupled to an audio coder/decoder (codec) 2147.

The audio codec 2147 may be used for coding and/or decoding audio signals. The audio codec 2147 may be coupled to at least one speaker 2139, an earpiece 2141, an output jack 2143 and/or at least one microphone 2145. The speakers 2139 may include one or more electro-acoustic transducers that convert electrical or electronic signals into acoustic signals. For example, the speakers 2139 may be used to play music or output a speakerphone conversation, etc. The earpiece 2141 may be another speaker or electro-acoustic transducer that can be used to output acoustic signals (e.g., speech signals) to a user. For example, the earpiece 2141 may be used such that only a user may reliably hear the acoustic signal. The output jack 2143 may be used for coupling other devices to the wireless communication device 2137 for outputting audio, such as headphones. The speakers 2139, earpiece 2141 and/or output jack 2143 may generally be used for outputting an audio signal from the audio codec 2147. The at least one microphone 2145 may be an acousto-electric transducer that converts an acoustic signal (such as a user's voice) into electrical or electronic signals that are provided to the audio codec 2147.

The wireless communication device 2140 may include one or more of the electronic circuitries 1014, 1214, 1414, 1614, 2014 described herein. For example, the microphone 2145 may be an example of one or more of the electronic circuitries 1014, 1214, 1414, 1614, 2014 described herein.

The application processor 2111 may also be coupled to a power management circuit 2121. One example of a power management circuit 2121 is a power management integrated circuit (PMIC), which may be used to manage the electrical power consumption of the wireless communication device 2137. The power management circuit 2121 may be coupled to a battery 2123. The battery 2123 may generally provide electrical power to the wireless communication device 2137. For example, the battery 2123 and/or the power management circuit 2121 may be coupled to at least one of the elements included in the wireless communication device 2137.

The application processor 2111 may be coupled to at least one input device 2125 for receiving input. Examples of input devices 2125 include infrared sensors, image sensors, accelerometers, touch sensors, keypads, etc. The input devices 2125 may allow user interaction with the wireless communication device 2137. The application processor 2111 may also be coupled to one or more output devices 2127. Examples of output devices 2127 include printers, projectors, screens, haptic devices, etc. The output devices 2127 may allow the wireless communication device 2137 to produce output that may be experienced by a user.

The application processor 2111 may be coupled to application memory 2129. The application memory 2129 may be any electronic device that is capable of storing electronic information. Examples of application memory 2129 include double data rate synchronous dynamic random access memory (DDRAM), synchronous dynamic random access memory (SDRAM), flash memory, etc. The application memory 2129 may provide storage for the application processor 2111. For instance, the application memory 2129 may store data and/or instructions for the functioning of programs that are run on the application processor 2111.

The application processor 2111 may be coupled to a display controller 2131, which in turn may be coupled to a display 2133. The display controller 2131 may be a hardware block that is used to generate images on the display 2133. For example, the display controller 2131 may translate instructions and/or data from the application processor 2111 into images that can be presented on the display 2133. Examples of the display 2133 include liquid crystal display (LCD) panels, light emitting diode (LED) panels, cathode ray tube (CRT) displays, plasma displays, etc.

The application processor 2111 may be coupled to a baseband processor 2113. The baseband processor 2113 generally processes communication signals. For example, the baseband processor 2113 may demodulate and/or decode received signals. Additionally or alternatively, the baseband processor 2113 may encode and/or modulate signals in preparation for transmission.

The baseband processor 2113 may be coupled to baseband memory 2135. The baseband memory 2135 may be any electronic device capable of storing electronic information, such as SDRAM, DDRAM, flash memory, etc. The baseband processor 2113 may read information (e.g., instructions and/or data) from and/or write information to the baseband memory 2135. Additionally or alternatively, the baseband processor

2113 may use instructions and/or data stored in the baseband memory 2135 to perform communication operations.

The baseband processor 2113 may be coupled to a radio frequency (RF) transceiver 2115. The RF transceiver 2115 may be coupled to a power amplifier 2117 and one or more antennas 2119. The RF transceiver 2115 may transmit and/or receive radio frequency signals. For example, the RF transceiver 2115 may transmit an RF signal using a power amplifier 2117 and at least one antenna 2119. The RF transceiver 2115 may also receive RF signals using the one or more antennas 2119.

In some configurations, the audio codec 2147 is a hardware codec that is coupled to the microphones 2145 and speakers 2139. The audio codec 2147 may be a separate integrated circuit or may be integrated within a modem (e.g., the baseband processor 2113), within the power management circuit 2121 (e.g., PMIC) or other processor chips. The microphone(s) 2145 may be coupled to the audio codec 2147 (which may be external to the microphone(s) 2145, for example) with a bus that is an open interface. Accordingly, the microphone(s) 2145 (or a speaker amp, for example) may be connected directly to a processor in some configurations.

Figure 22:
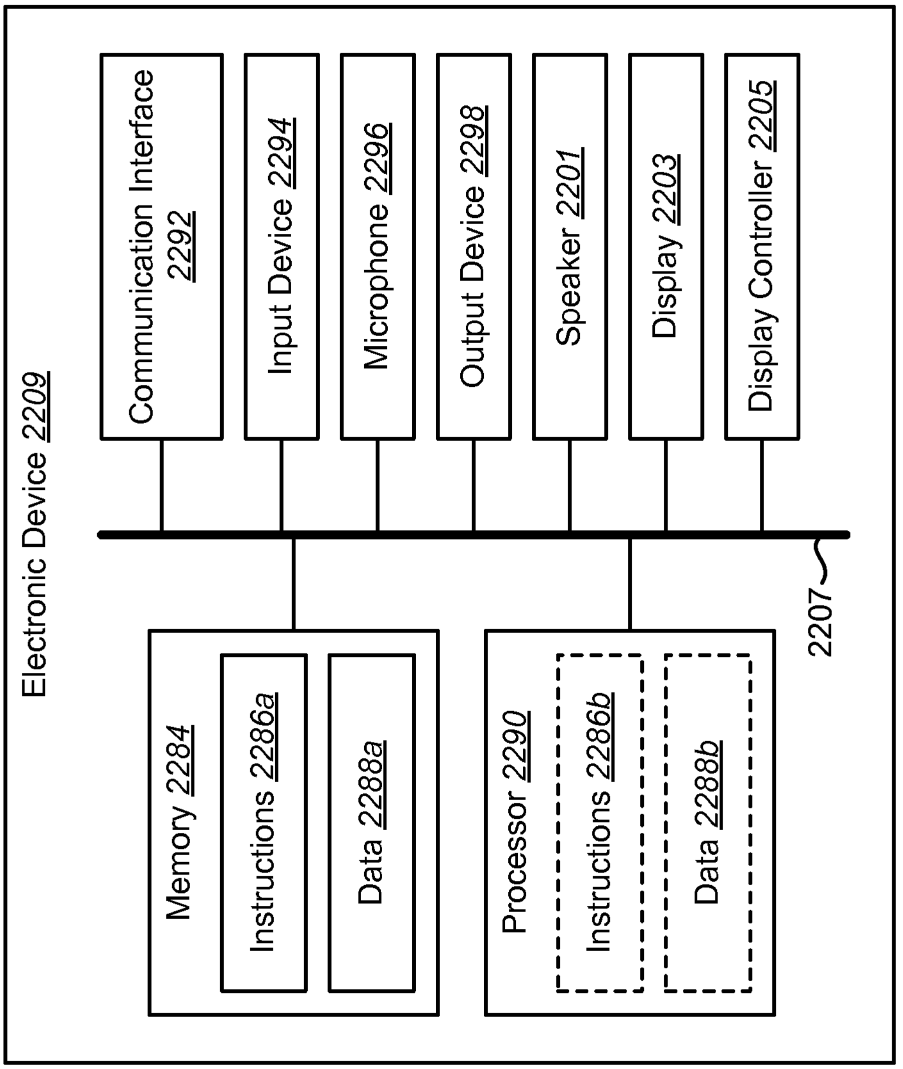
FIG. 22 illustrates various components that may be utilized in an electronic device.

FIG. 22 illustrates various components that may be utilized in an electronic device 2209. The illustrated components may be located within the same physical structure or in separate housings or structures. The electronic device 2209 described in connection with FIG. 22 may be implemented in accordance with one or more of the electronic circuitries and/or the wireless communication device 2140 described herein. For example, the electronic device 2209 may include and/or be one or more of the electronic circuitries 1014, 1214, 1414, 1614, 2014 described herein. In one specific example, the microphone 2296 included in the electronic device 2209 may be an example of one or more of the electronic circuitries 1014, 1214, 1414, 1614, 2014 described herein.

The electronic device 2209 includes a processor 2290. The processor 2290 may be a general purpose single- or multi-chip microprocessor (e.g., an ARM), a special purpose microprocessor (e.g., a digital signal processor (DSP)), a microcontroller, a programmable gate array, etc. The processor 2290 may be referred to as a central processing unit (CPU). Although just a single processor 2290 is shown in the electronic device 2209 of FIG. 22, in an alternative configuration, a combination of processors (e.g., an ARM and DSP) could be used.

The electronic device 2209 also includes memory 2284 in electronic communication with the processor 2290. That is, the processor 2290 can read information from and/or write information to the memory 2284. The memory 2284 may be any electronic component capable of storing electronic information. The memory 2284 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 2288*a* and instructions 2286*a* may be stored in the memory 2284. The instructions 2286*a* may include one or more programs, routines, sub-routines, functions, procedures, etc. The instructions 2286*a* may include a single computer-readable statement or many computer-readable statements. The instructions 2286*a* may be executable by the processor 2290 to implement one or more of the methods, functions and procedures described above. Executing the instructions 2286*a* may involve the use of the data 2288*a* that is stored in the memory 2284. FIG. 22 shows some instructions 2286*b* and data 2288*b* being loaded into the processor 2290 (which may come from instructions 2286*a* and data 2288*a*).

The electronic device 2209 may also include one or more communication interfaces 2292 for communicating with other electronic devices. The communication interfaces 2292 may be based on wired communication technology, wireless communication technology, or both. Examples of different types of communication interfaces 2292 include a serial port, a parallel port, a Universal Serial Bus (USB), an Ethernet adapter, an Institute of Electrical and Electronics Engineers (IEEE) 1394 bus interface, a small computer system interface (SCSI) bus interface, an infrared (IR) communication port, a Bluetooth wireless communication adapter, a 3rd Generation Partnership Project (3GPP) transceiver, an IEEE 802.11 ("Wi-Fi") transceiver and so forth. For example, the communication interface 2292 may be coupled to one or more antennas (not shown) for transmitting and receiving wireless signals.

The electronic device 2209 may also include one or more input devices 2294 and one or more output devices 2298. Examples of different kinds of input devices 2294 include a keyboard, mouse, microphone, remote control device, button, joystick, trackball, touchpad, lightpen, etc. For instance, the electronic device 2209 may include one or more microphones 2296 for capturing acoustic signals. In one configuration, a microphone 2296 may be a transducer that converts acoustic signals (e.g., voice, speech) into electrical or electronic signals. Examples of different kinds of output devices 2298 include a speaker, printer, etc. For instance, the electronic device 2209 may include one or more speakers 2201. In one configuration, a speaker 2201 may be a transducer that converts electrical or electronic signals into acoustic signals. One specific type of output device that may be typically included in an electronic device 2209 is a display device 2203. Display devices 2203 used with configurations disclosed herein may utilize any suitable image projection technology, such as a cathode ray tube (CRT), liquid crystal display (LCD), light-emitting diode (LED), gas plasma, electroluminescence, or the like. A display controller 2205 may also be provided, for converting data stored in the memory 2284 into text, graphics, and/or moving images (as appropriate) shown on the display device 2203.

The various components of the electronic device 2209 may be coupled together by one or more buses, which may include a power bus, a control signal bus, a status signal bus, a data bus, etc. For simplicity, the various buses are illustrated in FIG. 22 as a bus system 2207. It should be noted that FIG. 22 illustrates only one possible configuration of an electronic device 2209. Various other architectures and components may be utilized.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term “determining” encompasses a wide variety of actions and, therefore, “determining” can include calculating, computing, processing, deriving, investigating, looking up (e.g., looking up in a table, a database or another data structure), ascertaining and the like. Also, “determining” can include receiving (e.g., receiving information), accessing (e.g., accessing data in a memory) and the like. Also, “determining” can include resolving, selecting, choosing, establishing and the like.

The phrase “based on” does not mean “based only on,” unless expressly specified otherwise. In other words, the phrase “based on” describes both “based only on” and “based at least on.”

It should be noted that one or more of the features, functions, procedures, components, elements, structures, etc., described in connection with any one of the configurations described herein may be combined with one or more of the functions, procedures, components, elements, structures, etc., described in connection with any of the other configurations described herein, where compatible. In other words, any compatible combination of the functions, procedures, components, elements, etc., described herein may be implemented in accordance with the systems and methods disclosed herein.

The functions described herein may be stored as one or more instructions on a processor-readable or computer-readable medium. The term “computer-readable medium” refers to any available medium that can be accessed by a computer or processor. By way of example, and not limitation, such a medium may comprise Random-Access Memory (RAM), Read-Only Memory (ROM), Electrically Erasable Programmable Read-Only Memory (EEPROM), flash memory, Compact Disc Read-Only Memory (CD-ROM) or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term “computer-program product” refers to a computing device or processor in combination with code or instructions (e.g., a “program”) that may be executed, processed or computed by the computing device or processor. As used herein, the term “code” may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. Electronic circuitry, comprising:

a first microelectromechanical system (MEMS) structure configured to exhibit a first frequency response in a voice frequency range and to capture a first signal;

a second MEMS structure coupled to the first MEMS structure, wherein the second MEMS structure is configured to exhibit a second frequency response in an ultrasound frequency range and to capture a second signal, wherein a combination of the first frequency response and the second frequency response achieves a target frequency response in a combined frequency range;

automatic gain control (AGC) circuitry coupled to the second MEMS structure, wherein the AGC circuitry is configured to adjust processing in the ultrasound frequency range when a signal level meets or exceeds an amplitude threshold; and a summer configured to combine the first signal and the second signal.

2. The electronic circuitry of claim 1, further comprising a high-pass filter coupled to the second MEMS structure, wherein the high-pass filter is configured to mitigate audio frequency range intermodulation distortion (IMD) caused by the second signal.

3. The electronic circuitry of claim 1, wherein adjusting the processing comprises deactivating the second MEMS structure.

4. The electronic circuitry of claim 1, wherein adjusting the processing comprises adjusting the frequency response of the second MEMS structure.

5. The electronic circuitry of claim 1, wherein adjusting the processing comprises reducing a gain of the second MEMS structure.

6. A method for providing a wide band frequency response by electronic circuitry, comprising:

capturing a first signal by a first microelectromechanical system (MEMS) structure that exhibits a first frequency response in a voice frequency range;

capturing a second signal by a second MEMS structure that exhibits a second frequency response in an ultrasound frequency range, wherein a combination of the first frequency response and the second frequency response achieves a target frequency response in a combined frequency range;

performing automatic gain control (AGC) based on the second signal, wherein performing AGC comprises adjusting processing in the ultrasound frequency range when a signal level of the second signal meets or exceeds an amplitude threshold; and combining the first signal and the second signal.

7. The method of claim 6, further comprising mitigating audio frequency range intermodulation distortion (IMD) caused by the second signal.

8. The method of claim 6, wherein adjusting the processing comprises deactivating the second MEMS structure.

9. The method of claim 6, wherein adjusting the processing comprises adjusting the frequency response of the second MEMS structure.

10. The method of claim 6, wherein adjusting the processing comprises reducing a gain of the second MEMS structure.

11. A non-transitory tangible computer-readable medium having instructions thereon, the instructions comprising:

code for causing electronic circuitry to capture a first signal by a first microelectromechanical system (MEMS) structure that exhibits a first frequency response in a voice frequency range;

code for causing the electronic circuitry to capture a second signal by a second MEMS structure that exhibits a second frequency response in an ultrasound frequency range, wherein a combination of the first frequency response and the second frequency response achieves a target frequency response in a combined frequency range;

code for causing the electronic circuitry to perform automatic gain control (AGC) based on the second signal, wherein performing AGC comprises adjusting processing in the ultrasound frequency range when a signal level meets or exceeds an amplitude threshold; and code for causing the electronic circuitry to combine the first signal and the second signal.

12. The non-transitory tangible computer-readable medium of claim 11, wherein the instructions further comprise code for causing the electronic circuitry to mitigate audio frequency range intermodulation distortion (IMD) caused by the second signal.

13. The non-transitory tangible computer-readable medium of claim 11, wherein adjusting the processing comprises deactivating the second MEMS structure.

14. The non-transitory tangible computer-readable medium of claim 11, wherein adjusting the processing comprises adjusting the frequency response of the second MEMS structure.

15. The non-transitory tangible computer-readable medium of claim 11, wherein adjusting the processing comprises reducing a gain of the second MEMS structure.

16. An apparatus for providing a wide band frequency response, comprising:

means for capturing a first signal, wherein the means for capturing the first signal exhibits a first frequency response in a voice frequency range;

means for capturing a second signal coupled to the means for capturing the first signal, wherein the means for capturing the second signal exhibits a second frequency response in an ultrasound frequency range, wherein a combination of the first frequency response and the second frequency response achieves a target frequency response in a combined frequency range;

means for performing automatic gain control (AGC) based on the second signal, wherein the mean for performing AGC comprises means for adjusting processing in the ultrasound frequency range when a signal level of the second signal meets or exceeds an amplitude threshold; and means for combining the first signal and the second signal.

17. The apparatus of claim 16, further comprising means for high-pass filtering coupled to the means for capturing the second signal, wherein the means for high-pass filtering mitigates audio frequency range intermodulation distortion (IMD) caused by the second signal.

18. The apparatus of claim 16, wherein adjusting the processing comprises deactivating the means for capturing the second signal.

19. The apparatus of claim 16, wherein adjusting the processing comprises adjusting the frequency response of the means for capturing the second signal.

20. The apparatus of claim 16, wherein adjusting the processing comprises reducing a gain of the means for capturing the second signal.

* * * * *